(12) United States Patent
Forbes

(10) Patent No.: US 7,662,701 B2
(45) Date of Patent: Feb. 16, 2010

(54) GETTERING OF SILICON ON INSULATOR USING RELAXED SILICON GERMANIUM EPITAXIAL PROXIMITY LAYERS

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 1352 days.

(21) Appl. No.: 10/443,337

(22) Filed: May 21, 2003

(65) Prior Publication Data

US 2004/0235264 A1 Nov. 25, 2004

(51) Int. Cl.
*H01L 21/322* (2006.01)
(52) U.S. Cl. .................. 438/471; 438/473; 438/476; 257/E21.32
(58) Field of Classification Search .......... 438/402, 438/406, 407, 412, 471, 476, 473; 257/E21.318, 257/E21.32
See application file for complete search history.

(56) References Cited

U.S. PATENT DOCUMENTS

| 4,053,925 A | 10/1977 | Burr et al. |
| 4,241,359 A | 12/1980 | Izumi et al. ................ 257/386 |
| 4,314,595 A | 2/1982 | Yamamoto et al. ........... 148/1.5 |
| 4,589,928 A | 5/1986 | Dalton ...................... 438/142 |
| 4,631,234 A | 12/1986 | Larrabee |
| 4,717,681 A | 1/1988 | Curran ....................... 438/314 |
| 4,962,051 A | 10/1990 | Liaw |
| 4,962,061 A | 10/1990 | Takata |
| 4,996,627 A | 2/1991 | Zias et al. |
| 5,063,113 A | 11/1991 | Wada |
| 5,234,535 A | 8/1993 | Beyer et al. ................ 156/630 |
| 5,240,876 A | 8/1993 | Gaul et al. |
| 5,261,999 A | 11/1993 | Pinker et al. |
| 5,298,452 A | 3/1994 | Meyerson |
| 5,343,064 A | 8/1994 | Spangler et al. |
| 5,344,524 A | 9/1994 | Sharma et al. |
| 5,426,061 A | 6/1995 | Sopori ....................... 438/475 |
| 5,426,069 A | 6/1995 | Selvakumar et al. |
| 5,441,591 A | 8/1995 | Imthurn et al. ............. 156/153 |
| 5,443,661 A | 8/1995 | Oguro et al. ............... 148/33.5 |

(Continued)

FOREIGN PATENT DOCUMENTS

EP 434984 9/1991

(Continued)

OTHER PUBLICATIONS

Lu, X., et al., "SiGe and SiGeC Surface Alloy Formation Using High-Dose Implantation and Solid Phase Epitaxy", *Proceedings of the 11th International Conference on Ion Implantation Technology*, Austin, TX, (1997), 686-689.

(Continued)

*Primary Examiner*—Zandra Smith
*Assistant Examiner*—Toniae M Thomas
(74) *Attorney, Agent, or Firm*—Schwegman, Lundberg & Woessner, P.A.

(57) ABSTRACT

One aspect of this disclosure relates to a method for creating proximity gettering sites in a silicon on insulator (SOI) wafer. In various embodiments of this method, a relaxed silicon germanium region is formed over an insulator region of the SOI to be proximate to a device region. The relaxed silicon germanium region generates defects to getter impurities from the device region. Other aspects are provided herein.

75 Claims, 19 Drawing Sheets

U.S. PATENT DOCUMENTS

| | | | |
|---|---|---|---|
| 5,461,243 A | 10/1995 | Ek et al. ..................... 257/190 |
| 5,476,813 A | 12/1995 | Naruse |
| 5,482,869 A | 1/1996 | Kohyama |
| 5,489,792 A | 2/1996 | Hu et al. |
| 5,534,713 A | 7/1996 | Ismail et al. |
| 5,646,053 A | 7/1997 | Schepis et al. ............. 438/402 |
| 5,661,044 A | 8/1997 | Holland et al. ............. 438/766 |
| 5,679,475 A | 10/1997 | Yamagata et al. |
| 5,684,997 A | 11/1997 | Kau et al. |
| 5,691,230 A | 11/1997 | Forbes ........................ 437/62 |
| 5,698,869 A | 12/1997 | Yoshimi et al. |
| 5,723,896 A | 3/1998 | Yee et al. |
| 5,735,949 A | 4/1998 | Mantl et al. |
| 5,759,898 A | 6/1998 | Ek et al. ..................... 438/291 |
| 5,773,152 A | 6/1998 | Okonogi ..................... 428/446 |
| 5,789,859 A | 8/1998 | Watkins et al. ............. 313/495 |
| 5,818,761 A | 10/1998 | Onakado et al. |
| 5,840,590 A | 11/1998 | Myers, Jr. et al. ........... 438/471 |
| 5,858,819 A | 1/1999 | Miyasaka |
| 5,879,996 A | 3/1999 | Forbes ........................ 438/289 |
| 5,891,769 A | 4/1999 | Liaw et al. |
| 5,900,652 A | 5/1999 | Battaglia et al. |
| 5,906,951 A | 5/1999 | Chu et al. |
| 5,949,102 A | 9/1999 | Saida et al. ................. 257/315 |
| 5,961,877 A | 10/1999 | Robinson et al. |
| 5,963,817 A | 10/1999 | Chu et al. ................... 438/410 |
| 5,997,378 A | 12/1999 | Dynka et al. ................ 445/25 |
| 6,001,711 A | 12/1999 | Hashimoto .................. 438/473 |
| 6,022,793 A | 2/2000 | Wijaranakula et al. ...... 438/473 |
| 6,049,106 A | 4/2000 | Forbes |
| 6,054,808 A | 4/2000 | Watkins et al. ............. 313/495 |
| 6,083,324 A | 7/2000 | Henley et al. ............. 148/33.2 |
| 6,093,623 A | 7/2000 | Forbes ........................ 438/455 |
| 6,093,624 A | 7/2000 | Letavic et al. ............... 438/462 |
| 6,096,433 A | 8/2000 | Kikuchi et al. ............. 428/446 |
| 6,103,598 A | 8/2000 | Yamagata et al. |
| 6,110,793 A | 8/2000 | Lee et al. ................... 438/400 |
| 6,127,777 A | 10/2000 | Watkins et al. ............. 313/554 |
| 6,136,666 A | 10/2000 | So .............................. 438/458 |
| 6,143,628 A | 11/2000 | Sato et al. |
| 6,172,456 B1 | 1/2001 | Cathey et al. ............... 313/495 |
| 6,174,784 B1 | 1/2001 | Forbes ........................ 438/405 |
| 6,180,487 B1 | 1/2001 | Lin |
| 6,185,144 B1 | 2/2001 | Suzuki |
| 6,204,145 B1 | 3/2001 | Noble ......................... 438/412 |
| 6,228,694 B1 | 5/2001 | Doyle et al. ................. 438/199 |
| 6,243,299 B1 | 6/2001 | Rinerson et al. |
| 6,251,751 B1 | 6/2001 | Chu et al. ................... 438/439 |
| 6,261,876 B1 | 7/2001 | Crowder et al. ............. 438/149 |
| 6,271,273 B1 | 8/2001 | You et al. |
| 6,274,457 B1 | 8/2001 | Sakai et al. ................. 438/424 |
| 6,274,460 B1 | 8/2001 | Delgado et al. ............. 438/476 |
| 6,309,950 B1 | 10/2001 | Forbes ........................ 438/455 |
| 6,315,826 B1 | 11/2001 | Muramatsu .................. 117/95 |
| 6,328,796 B1 | 12/2001 | Kub et al. |
| 6,337,260 B1 | 1/2002 | Ishida |
| 6,338,805 B1 | 1/2002 | Anderson .................... 216/89 |
| 6,339,011 B1 | 1/2002 | Gonzalez et al. ............ 438/473 |
| 6,368,938 B1 | 4/2002 | Usenko ........................ 438/407 |
| 6,376,336 B1 | 4/2002 | Buynoski .................... 438/476 |
| 6,377,070 B1 | 4/2002 | Forbes ........................ 326/41 |
| 6,423,613 B1 | 7/2002 | Geusic ........................ 438/455 |
| 6,424,001 B1 | 7/2002 | Forbes et al. ................ 257/315 |
| 6,437,375 B1 | 8/2002 | Beaman |
| 6,444,534 B1 | 9/2002 | Maszara ...................... 438/311 |
| 6,448,157 B1 | 9/2002 | Okonogi |
| 6,448,601 B1 | 9/2002 | Forbes et al. ................ 257/302 |
| 6,451,672 B1 | 9/2002 | Caruso et al. |
| 6,455,397 B1 | 9/2002 | Belford |
| 6,461,933 B2 | 10/2002 | Houston ...................... 438/423 |
| 6,465,873 B1 | 10/2002 | Gonzalez |
| 6,476,434 B1 | 11/2002 | Noble et al. ................. 257/302 |
| 6,478,883 B1 | 11/2002 | Tamatsuka et al. ......... 148/33.2 |
| 6,486,008 B1 | 11/2002 | Lee |
| 6,496,034 B2 | 12/2002 | Forbes et al. ................ 326/41 |
| 6,514,836 B2 | 2/2003 | Belford |
| 6,515,335 B1* | 2/2003 | Christiansen et al. ....... 257/347 |
| 6,531,727 B2 | 3/2003 | Forbes et al. ................ 257/302 |
| 6,538,330 B1 | 3/2003 | Forbes ........................ 257/777 |
| 6,541,356 B2 | 4/2003 | Fogel et al. ................. 438/480 |
| 6,559,491 B2 | 5/2003 | Forbes et al. ................ 257/296 |
| 6,566,682 B2 | 5/2003 | Forbes ........................ 257/51 |
| 6,583,052 B2 | 6/2003 | Shin ........................... 438/630 |
| 6,583,437 B2 | 6/2003 | Mizuno et al. ............... 257/19 |
| 6,593,625 B2 | 7/2003 | Christiansen et al. ....... 257/347 |
| 6,597,203 B2 | 7/2003 | Forbes ........................ 326/98 |
| 6,620,683 B1 | 9/2003 | Lin et al. ..................... 438/257 |
| 6,630,713 B2 | 10/2003 | Geusic ........................ 257/347 |
| 6,649,476 B2 | 11/2003 | Forbes ........................ 438/268 |
| 6,649,480 B2* | 11/2003 | Fitzgerald et al. ........... 438/285 |
| 6,649,492 B2* | 11/2003 | Chu et al. ................... 438/478 |
| 6,656,782 B2 | 12/2003 | Skotnicki et al. ............ 438/221 |
| 6,656,822 B2 | 12/2003 | Doyle et al. |
| 6,689,671 B1 | 2/2004 | Yu et al. |
| 6,703,293 B2 | 3/2004 | Tweet et al. ................. 438/518 |
| 6,703,648 B1 | 3/2004 | Xiang et al. ................. 257/192 |
| 6,713,326 B2 | 3/2004 | Cheng et al. |
| 6,717,216 B1 | 4/2004 | Doris et al. |
| 6,740,913 B2 | 5/2004 | Doyle et al. |
| 6,746,937 B2 | 6/2004 | Beaman |
| 6,809,016 B1* | 10/2004 | Xiang ......................... 438/556 |
| 6,825,102 B1 | 11/2004 | Bedell et al. |
| 6,900,094 B2 | 5/2005 | Hammond et al. |
| 6,902,616 B1 | 6/2005 | Yamazaki et al. |
| 6,929,984 B2 | 8/2005 | Forbes et al. |
| 6,987,037 B2 | 1/2006 | Forbes |
| 7,008,854 B2 | 3/2006 | Forbes |
| 7,023,051 B2 | 4/2006 | Forbes |
| 7,041,575 B2 | 5/2006 | Forbes |
| 7,045,874 B2 | 5/2006 | Forbes |
| 7,084,429 B2 | 8/2006 | Forbes |
| 7,115,480 B2 | 10/2006 | Forbes |
| 7,153,753 B2 | 12/2006 | Forbes |
| 7,198,974 B2 | 4/2007 | Forbes |
| 7,202,530 B2 | 4/2007 | Forbes |
| 7,220,656 B2 | 5/2007 | Forbes |
| 7,262,428 B2 | 8/2007 | Forbes |
| 7,271,445 B2 | 9/2007 | Forbes |
| 7,273,788 B2 | 9/2007 | Forbes |
| 7,326,597 B2 | 2/2008 | Forbes et al. |
| 7,368,790 B2 | 5/2008 | Forbes |
| 7,394,111 B2 | 7/2008 | Forbes |
| 7,429,763 B2 | 9/2008 | Forbes |
| 7,439,158 B2 | 10/2008 | Forbes et al. |
| 2001/0003269 A1 | 6/2001 | Wu et al. |
| 2001/0052621 A1* | 12/2001 | Beaman ...................... 257/347 |
| 2002/0001965 A1 | 1/2002 | Forbes ........................ 438/734 |
| 2002/0070421 A1 | 6/2002 | Ashburn ...................... 257/510 |
| 2002/0125471 A1* | 9/2002 | Fitzgerald et al. ............ 257/19 |
| 2002/0135020 A1 | 9/2002 | Skotnicki et al. ............ 257/368 |
| 2002/0175330 A1 | 11/2002 | Geusic et al. |
| 2002/0185686 A1* | 12/2002 | Christiansen et al. ....... 257/347 |
| 2003/0013323 A1 | 1/2003 | Hammond et al. .......... 438/981 |
| 2003/0027406 A1 | 2/2003 | Malone ....................... 438/471 |
| 2003/0131782 A1 | 7/2003 | Geusic et al. |
| 2003/0201468 A1 | 10/2003 | Christiansen et al. ....... 257/200 |
| 2003/0218189 A1* | 11/2003 | Christiansen et al. ....... 257/200 |
| 2003/0227072 A1 | 12/2003 | Forbes ........................ 257/616 |
| 2004/0005740 A1 | 1/2004 | Lochtefeld et al. |
| 2004/0048450 A1 | 3/2004 | Tweet et al. |
| 2004/0135138 A1 | 7/2004 | Hsu et al. |
| 2004/0173798 A1 | 9/2004 | Forbes |
| 2004/0217352 A1 | 11/2004 | Forbes |
| 2004/0217391 A1 | 11/2004 | Forbes |

| | | | |
|---|---|---|---|
| 2004/0224480 A1 | 11/2004 | Forbes | |
| 2004/0232422 A1 | 11/2004 | Forbes | |
| 2004/0232487 A1 | 11/2004 | Forbes | |
| 2004/0232488 A1 | 11/2004 | Forbes | |
| 2005/0017273 A1 | 1/2005 | Forbes et al. | |
| 2005/0020094 A1 | 1/2005 | Forbes et al. | |
| 2005/0023529 A1 | 2/2005 | Forbes | |
| 2005/0023612 A1 | 2/2005 | Forbes | |
| 2005/0023616 A1 | 2/2005 | Forbes | |
| 2005/0029619 A1 | 2/2005 | Forbes | |
| 2005/0029683 A1 | 2/2005 | Forbes et al. | |
| 2005/0032296 A1 | 2/2005 | Forbes | |
| 2005/0087842 A1 | 4/2005 | Forbes | |
| 2005/0250274 A1 | 11/2005 | Forbes et al. | |
| 2005/0285139 A1 | 12/2005 | Forbes | |
| 2006/0001094 A1 | 1/2006 | Forbes | |
| 2006/0011982 A1 | 1/2006 | Forbes | |
| 2006/0097281 A1 | 5/2006 | Forbes | |
| 2006/0208343 A1 | 9/2006 | Forbes | |
| 2006/0258063 A1 | 11/2006 | Forbes | |
| 2006/0258123 A1 | 11/2006 | Forbes | |
| 2006/0267152 A1 | 11/2006 | Forbes | |
| 2007/0075401 A1 | 4/2007 | Forbes et al. | |
| 2007/0080335 A1 | 4/2007 | Forbes et al. | |
| 2007/0096193 A1 | 5/2007 | Forbes | |
| 2008/0078988 A1 | 4/2008 | Forbes | |

FOREIGN PATENT DOCUMENTS

| | | | |
|---|---|---|---|
| JP | 54-152464 A | 11/1979 | |
| JP | 54-155770 A | 12/1979 | |
| JP | 04-304653 | 10/1992 | |
| JP | 04372152 | 12/1992 | |
| WO | WO02097982 | 12/2002 | |

OTHER PUBLICATIONS

Kal, S., et al., "Strained Silicon-SiGe Devices Using Germanium Implantation", *IETE Journal of Research*, 43 (2-3), (Mar. 1997),185-192.

Xiao, Q., et al., "Preparation of thin Strained Si Film by Low Temperature Ge Ion Implantation and High Temperature Annealing", *Solid-State and Integrated Circuits Technology, 2004. Proceedings 7th Int'l Conf.*, 3(3), (Oct. 18, 2004),2163-2166.

Dharmatilleke, S N., et al., "Anodic Bonding of Glass to Glass and Silicon to Glass or Silicon to Silicon Through a Very Thick Thermally Grown $SiO_2$ Layer", *Proceedings of IS 3M International Symposium on Smart Structures and Microsystems*, http://dolphin.eng.uc.edu/projects/bonding/paper.pdf,(2000),32.

Imthurn, George P., et al., "Bonded Silicon-on-Sapphire Wafers and Devices", *Journal of Applied Physics*, 72(6), (Sep. 1992),2526-7.

Jurczak, M, "SON (silicon on nothing)-a new device architecture for the ULSI era", *VLSI Technology, 1999. Digest of Technical Papers. 1999 Symposium on*, Jun. 14-16, 1999, (Jun. 1999),29-30.

Mitsutake, K, "Theoretical Study on the Formation Process of Empty Space in Silicon (ESS)", *2000 International Conference on Solid State Devices and Materials*, (2000),198-199.

Mizushima, I., "Empty-space-in-silicon technique for fabricating a silicon-on-nothing structure", *Applied Physics Letters*, 77(20), American Institute of Physics, NY,(Nov. 13, 2000),3290-3292.

"Cornell Demonstrates a Universal Substrate", *Compound Semiconductor*, 3(2), (Mar./Apr. 1997),27-29.

Abe, T, "Silicon Wafer-Bonding Process Technology for SOI Structures", *Extended Abstracts of the 22nd (1990 International) Conference on Solid State Devices and Materials*, (1990),853-856.

Auberton-Herve, A J., "SOI: Materials to Systems", *International Electron Devices Meeting. Technical Digest*, (1996),3-10.

Autumn, Kellar, et al., "Adhesive force of a single gecko foot-hair", *Nature*, 405(6787), (Jun. 2000),681-685.

Autumn, Kellar, et al., "Evidence for van der Waals adhesion in gecko setae.", *Proceedings of the National Academy of Science U S A.*, 99(19), (Sep. 17, 2002),12252-6.

Baginski, T. A., "Back-side germanium ion implantation gettering of silicon", *Journal of the Electrochemical Society*, 135(7), Dept of Electrical Engineering, Auburn Univ, AL,(Jul. 1988),1842-3.

Belford, Rona E., "Performance-Augmented CMOS Using Back-End Uniaxial Strain", *IEEE Device Research Conference*, (2002) ,41-42.

Berti, M., "Composition and Structure of Si-Ge Layers Produced by Ion Implantation and Laser Melting", *Journal of Materials Research*. 6(10); (Oct. 1991),2120-2126.

Berti, M., "Laser Induced Epitaxial Regrowth of Si]-xGex/Si Layers Produced by Ge Ion Implantation", *Applied Surface Science*, 43, (1989),158-164.

Bialas, F., et al., "Intrinsic Gettering of 300 mm CZ Wafers", *Microelectronic Engineering*, 56(1-2), (May 2001),157-63.

Biever, Celeste, "Secret of 'strained silicon' revealed: behind closed doors, Intel has perfected a novel way to improve chip performance.", *New Scientist*, 180(i2426-2428), (Dec. 20, 2003),27.

Binns, M. J., et al., "The Realization of Uniform and Reliable Intrinsic Gettering in 200mm P- & P/P Wafers for a Low Thermal Budget 0.18 mu m Advanced CMOS Logic Process", *Diffusion and Defect Data Pt.B: Solid State Phenomena*, 82-84, (2001),387-92.

Bronner, G. B., et al., "Physical Modeling of Backside Gettering", *Impurity Diffusion and Gettering in Silicon Symposium*, Sponsor: Mater. Res. Soc, Nov. 1984, Boston, MA,(1985),27-30.

Brown, Chappell, "Bonding twist hints at universal substrate", *EE Times*, (1997),2 pages.

Bruel, M, et al., "Smart-Cut: a new silicon on insulator material technology based on hydrogen implantation and wafer bonding", *Japanese Journal of Applied Physics*, Part 1 (Regular Papers, Short Notes & Review Papers), 36(3B),(1997),1636-1641.

Chen, Xiangdong, et al., "Vertical P-MOSFETs with heterojunction between source/drain and channel", *IEEE Device Research Conference*, (2000),25-26.

Chilton, B T., et al., "Solid phase epitaxial regrowth of strained Si(1-x)Ge(x)/Si strained layer structures amorphized by ion implantation", *Applied Physics Letters*, 54(1), (Jan. 2, 1989),42-44.

Choe, K. S., et al., "Minority-Carrier Lifetime Optimization in Silicon MOS Devices by Intrinsic Gettering", *Journal of Crystal Growth*, 218(2-4), (Sep. 2000),239-44.

Clark, Don, et al., "Intel unveils tiny new transistors: Process handles circuits 1/2000th the width of a human hair", *The Wall Street Journal*, (Aug. 13, 2002),3 pages.

Clifton, P A., et al., "A process for strained silicon n-channel HMOSFETs", *ESSDERC'96. Proceedings of the 26th European Solid State Device Research Conference*, (Sep. 1996),519-22.

Dubbelday, W B., et al., "Oscillatory strain relaxation in solid phase epitaxially regrown silicon on sapphire", *Proceedings of the First International Workshop Lattice Mismatched Thin Films*, (Sep. 13-15, 1998),13-17.

Fischetti, M V., et al., "Band structure, deformation potentials, and carrier mobility in strained Si, Ge, and SiGe alloys", *Journal of Applied Physics*, 80(4), (Aug. 15, 1996),2234-2252.

Fournel, F, et al., "Ultra High Precision Of The Tilt/Twist Misorientation Angles In Silicon/Silicon Direct Wafer Bonding", *Abstract—Electronic Materials Conference*, (Jun. 2002),9.

Garcia, G A., et al., "High-quality CMOS in thin (100 nm) silicon on sapphire", *IEEE Electron Device Letters*, 9(1), (Jan. 1988),32-34.

Godbole, H., et al., "An Investigation of Bulk Stacking Faults in Silicon Using Photocapacitance Transient Spectroscophy", *Materials Letters*, 8(6-7), Dept of Electr & Comput Engr, Oregon State Univ, Corvallis OR,(Jul. 1989),201-3.

Gong, S. S., et al., "Implantation Gettering in Silicon", *Solid-State Electronics*, 30(2), (Feb. 1987),209-11.

Graf, D., et al., "300 mm epi pp- wafer: is there sufficient gettering?", *High Purity Silicon VI. Proceedings of the Sixth International Symposium (Electrochemical Society Proceedings* vol. 2000-17) (SPIE vol. 4218), (2000),319-30.

Haddad, H., et al., "Carbon Doping Effects on Hot Electron Trapping", *28th Annual Proceedings. Reliability Physics 1990*, (Mar. 1990),288-9.

Haddad, H., et al., "Electrical Activity of Bulk Stacking Faults in Silicon", *Materials Letters*, 7(3), Hewlett-Packard Northwest Integrated Circuits Div, Corvallis OR,(Sep. 1988),99-101.

Harendt, Christine, "Silicon on Insulator Material by Wafer Bonding", *Journal of Electronic Materials*, 20(3), (Mar. 1991),267-77.

Iyer, S S., "Separation by Plasma Implantation of Oxygen (SPIMOX) operational phase space", *IEEE trans. on Plasma Science.* 25, (1997),1128-1135.

Kalavade, Pranav, et al., "A novel sub-10 nm transistor", *58th DRC. Device Research Conference. Conference Digest*, (Jun. 19-21, 2000),71-72.

Kang, J. S., et al., "Gettering in Silicon", Journal of Applied Physics. 65(8), Center for Solid State Electron Res., Arizona State Univ., Tempe, AZ,(Apr. 15, 1989),2974-85.

Kostrzewa, M, et al., "Testing the Feasibility of strain relaxed InAsP and InGaAs compliant substrates", *EMC 2003 International Conference Indium Phosphide and Related Materials. Conference Proceedings*, Other authors: G. Grenet et al,(Jun. 2003),8-9.

Kung, C. Y., et al., "The effect of carbon on oxygen precipitation in high carbon CZ silicon crystals", *Materials Research Bulletin*, 18(12), Silicon Materials Div., Fairchild Camera & Instrument Corp, Healdsburg, CA,(Dec. 1983),1437-41.

Lasky, J. B., "Wafer Bonding for Silicon-on-Insulator Technologies", *Applied Physics Letters*, 48(1), (Jan. 6, 1986),78-80.

Li, Y. X., et al., "New intrinsic gettering process in Czochralski-silicon wafer", *6th International Conference on Solid-State and Integrated Circuit Technology. Proceedings*, 1(1), (2001),277-9.

Loo, Y L., et al., "Contact Printing With Nanometer Resolution", *Device Research Conference*, (Jun. 2002),149-150.

Lu, D., "Bonding Silicon Wafers by Use of Electrostatic Fields Followed by Rapid Thermal Heating", *Materials Letters.* 4(11), (Oct. 1986),461-464.

Mizuno, T, et al., "Advanced SOI-MOSFETs with Strained-Si Channel for High Speed CMOS Electron/Hole Mobility Enhancement", *2000 Symposium on VLSI Technology. Digest of Technical Papers*, (2000),210-211.

Moran, Peter, "Strain Relaxation in Wafer-Bonded SiGe/Si Heterostructures Due to Viscous Flow of an Underlying Borosilicate Glass", *Electronic Materials Conference*, Santa Barbara, Jun. 2002, Abstract,(Jun. 2002),pp. 8-9.

Mumola, P. B., et al., "Recent advances in thinning of bonded SOI wafers by plasma assisted chemical etching", *Proceedings of the Third International Symposium on Semiconductor Wafer Bonding: Physics and Applications*, (1995),28-32.

Nayak, D.K., "High performance GeSi quantum-well PMOS on SIMOX", *International Electron Devices Meeting 1992. Technical Digest*, (1992),777-80.

Nichols, F A., "Surface-(inteface) and volume-diffusion contributions to morphological changes driven by capillarity", *Transactions of the American Institute of Mining, Metallurgical and Petroleum Engineers*, 233(10), (1965),1840-8.

O'Neill, A G., et al., "High speed deep sub-micron MOSFET using high mobility strained silicon channel", *ESSDERC '95. Proceedings of the 25th European Solid State Device Research Conference*, (Sep. 1995),109-12.

Omi, Hiroo, et al., "Semiconductor Surface with Strain Control", http://www.brl.ntt.co.jp/J/kouhou/katsudou/report00/E/report04_e.html.

Or, B S., et al., "Annealing effects of carbon in n-channel LDD MOSFETs", *IEEE Electron Device Letters*, 12(11), Dept of Electrical & Computing Engr, Oregon State Univ, Corvallis OR,(Nov. 1991),596-8.

Ouyang, Q, et al., "Bandgap Engineering in Deep Submicron Vertical pMOSFETs", *IEEE 58th DRC. Device Research Conference. Conference Digest.* (2000),27-28.

Paine, D. C., "The Growth of Strained Si]-xGex Alloys on (100) Silicon Using Solid Phase Epitaxy", *Journal of Materials Research*, 5(5), (May 1990),1023-1031.

People, R., "Calculation of critical layer thickness versus lattice mismatch for GexSi1-x/Si strained-layer heterostructures", *Applied Physics Letters*, 47(3), (Aug. 1, 1985),322-4.

Rim, Kern, et al., "Fabrication and analysis of deep submicron strained-Si n-MOSFET's", *IEEE Transactions on Electron Devices*, 47(7), (Jul. 2000),1406-1415.

Rim, Kern, et al., "Strained Si NMOSFETs for High Performance CMOS Technology", *2001 Symposium on VLSI Technology. Digest of Technical Papers*, (2001),59-60.

Rim, Kern, et al., "Transconductance enhancement in deep submicron strained Si n-MOSFETs", *International Electron Devices Meeting 1998. Technical Digest*, (1998),707-710.

Rubin, L, et al., "Effective gettering of oxygen by high dose, high energy boron buried layers", *1998 International Conference on Ion Implantation Technology. Proceedings*, 2(2), (1998),1010-13.

Sato, T, "A new substrate engineering for the formation of empty space in silicon (ESS) induced by silicon surface migration", *International Electron Devices Meeting 1999. Technical Digest*, (1999),517-20.

Sato, T, "Trench transformation technology using hydrogen annealing for realizing highly reliable device structure with thin dielectric films", *1998 Symposium on VLSI Technology Digest of Technical Papers*, (1998),206-7.

Sugiyama, N, et al., "Formation of strained-silicon layer on thin relaxed-SiGe/SiO/sub 2//Si structure using SIMOX technology", *Thin Solid Films*, 369(1-2), (Jul. 2000),199-202.

Takagi, Shin-Ichi, "Strained-Si- and SiGe-On-Insulator (Strained-SOI and SGOI) MOSFETs for High Performance/Low Power CMOS Application", *IEEE Device Research Conference. 2002. 60th DRC. Conference Digest*, (2002),37-40.

Tan, T. Y., et al., "Intrinsic gettering by oxide precipitate induced dislocations in Czochralski Si", *Applied Physics Letters*, 30(4), IBM System Products Div., Essex Junction, VT,(Feb. 15, 1977),175-6.

Verdonckt-Vandebroek,, Sophie, et al., "SiGe-Channel Heterojunction p-MOSFET's", *IEEE Transactions on Electron Devices*, 41(1), (Jan. 1994),90-101.

Welser, J, et al., "Strain dependence of the performance enhancement in strained-Si n-MOSFETs", *IEEE International Electron Devices Meeting 1994. Technical Digest*, (Dec. 11-14, 1994),373-376.

Whitwer, F. D., et al., "DLTS characterization of precipitation induced microdefects", *Materials Issues in Silicon Integrated Circuit Processing Symposium*, (Apr. 1986),53-57.

Wijaranakula, W., et al., "Effect of Pre- and Postepitaxial Deposition Annealing on Oxygen Precipitation in Silicon", *Journal of Materials Research*, 1(5), Dept of Electr & Comput Eng, Oregon State Univ, Corvallis, OR,(Sep.-Oct. 1986),698-704.

Wijaranakula, W., et al., "Effect of preanneal heat treatment on oxygen precipitation in epitaxial silicon", *Materials Issues in Silicon Integrated Circuit Processing Symposium*, (Apr. 1986),139-44.

Wijaranakula, W., et al., "Internal Gettering Heat Treatments and Oxygen Precipitation in Epitaxial Silicon Wafers", *Journal of Materials Research*, 1(5), Dept of Electr & Comput. Eng, Oregon State Univ., Corvallis, OR,(Sep.-Oct. 1986),693-7.

Wijaranakula, W., et al., "Oxygen precipitation in p/p+(100) epitaxial silicon material", *Journal of the Electrochemical Society*, 134(9), SEH America, Inc., Mater. Characterization Lab., Vancouver, WA,(Sep. 1987),2310-16.

Xuan, Peiqi, et al., "60nm Planarized Ultra-thin Body Solid Phase Epitaxy MOSFETs", *IEEE Device Research Conference, Conference Digest. 58th DRC*, (Jun. 19-21, 2000),67-68.

Yang, D., et al., "Intrinsic Gettering in Nitrogen Doped Czochralski Crystal Silicon", *High Purity Silicon VI. Proceedings of the Sixth International Symposium (Electrochemical Society Proceedings* vol. 2000-17) (SPIE vol. 4218), (2000),357-61.

Yang, Deren, et al., "Nitrogen in Czochralski Silicon", *2001 6th International Conference on Solid-State and Integrated Circuit Technology. Proceedings*, 1(1), (2001),255-60.

Yin, Haizhou, "High Ge-Content Relaxed Sil-xGex Layers by Relaxation on Complaint Substrate with Controlled Oxidation", *Electronic Materials Conference*, Santa Barbara, Jun. 2002,8.

Zhu, Z H., et al., "Wafer bonding and its application on compliant universal (CU) substrates", *Conference Proceedings, 10th Annual Meeting IEEE Lasers and Electro-Optics Society*, (Nov. 10-13, 1996),31.

Zhu, Z H., et al., "Wafer bonding technology and its applications in optoelectronic devices and materials", *IEEE Journal of Selected Topics in Quantum Electronics*, (Jun. 1997),927-936.

Irie, H., et al., "In-plane mobility anisotropy and universality under uni-axial strains in nand p-MOS inversion layers on (100), [110], and (111) Si", *IEEE International Electron Devices Meeting, 2004. IEDM Technical Digest.*, (Dec. 2004),225-228.

Thompson, S. E., "Key Differences For Process-induced Uniaxial vs. Substrate-induced Biaxial Stressed Si and Ge Channel MOSFETs", *IEEE International Electron Devices Meeting, 2004. IEDM Technical Digest.*, (Dec. 2004),221-224.

Wolf, S., et al., "Silicon Processing For The VLSI Era", *Lattice Press*, 1(1986),280-286.

Sato, T., et al., "SON (Silicon on Nothing) MOSFET using ESS (Empty Space in Silicon) technique for SoC applications", IEDM Technical Digest. International Electron Devices Meeting, (2001), 37.1.1-37.1.4.

* cited by examiner

GETTERING OF SILICON ON INSULATOR USING RELAXED SILICON GERMANIUM EPITAXIAL PROXIMITY LAYERS

CROSS REFERENCE TO RELATED APPLICATIONS

This application is related to the following commonly assigned U.S. patent applications which are herein incorporated by reference in their entirety: "Strained Si/SiGe Structures by Ion Implantation," U.S. application Ser. No. 10/431,134, filed on May 7, 2003; "Strained Silicon on Relaxed SiGe Semiconductor on Insulator," U.S. application Ser. No. 10/634,174, filed on Aug. 5, 2003; and "Wafer Gettering Using Relaxed Silicon Germanium Epitaxial Proximity Layers," U.S. application Ser. No. 10/443,339, filed on May 21, 2003.

TECHNICAL FIELD

This disclosure relates generally to semiconductors, and more particularly, to wafer gettering by relaxed silicon germanium layers in silicon on insulator (SOI) structures in close proximity to device layers.

BACKGROUND

Unwanted crystalline defects and impurities can be introduced during crystal growth or subsequent wafer fabrication processes. These defect and impurities can degrade device characteristics and overall yield. Gettering has been described as a process for moving contaminants and/or defects in a semiconductor into its bulk and away from its top surface to create a denuded zone cleared from contaminants and/or defects. Preferably, devices are built in the denuded zone.

Historically, extrinsic backside gettering was used to getter silicon wafers. Various extrinsic backside gettering processes involve damaging the backside of the wafer mechanically or by implanting argon, germanium, hydrogen or other implants, or providing a gettering layer on the backside of the wafer using a phophorosilicate glass or oxide backside layer, a polysilicon backside layer, and a silicon germanium (SiGe) backside epitaxial layer. Subsequently, "intrinsic" gettering was developed, which employed oxygen precipitation and "bulk microdefects" precipitated into the bulk of the wafer after the surface was "denuded" of oxygen. The precipitation process, the gettering effects, and the electrical characterization of defects and gettering silicon wafers have been investigated. Recently, intrinsic gettering modifications have been developed, including neutron irradiation, high boron doping, nitrogen doping, and the use of magnetic fields during crystal growth.

These gettering processes depend on the diffusion of unwanted impurities over significant distances to the gettering sites. However, modern low temperature processes have small thermal budgets, and do not afford an opportunity for significant diffusion of dopants and/or unwanted impurities. Thus, it is desirable to reduce the distance between the gettering sites and the device area. It has been previously proposed to implant various impurities in proximity to the device areas, to co-implant oxygen and silicon to form a gettering layer in close proximity to the device area, to implant helium to form cavities close to the device areas which getter impurities, and to getter material in trench isolation areas in close proximity to the device areas.

However, silicon on insulator (SOI) wafers and technology pose problems for backside extrinsic gettering and intrinsic gettering because of the intervening oxide layer between the active device silicon layer and the substrate. A number of techniques have been proposed to getter silicon on insulator layers. These proposed techniques include: a front-side polysilicon layer; a phosphorous doped oxide layer or phosphorous doped silicon layer in the SOI structure; microcavities formed by implantation; scribe lines; materials in or stress caused by trenches in the SOI structure; damage introduced by hydrogen implants; phosphorous doped microcrystalline silicon layers implant damaged regions in close proximity to device areas; and a carrier substrate with nitrogen and carbon.

SUMMARY

The above mentioned problems are addressed and will be understood by reading and studying this specification. This application discloses the use of relaxed silicon germanium as gettering sites in close proximity to device areas in SOI structures. The relaxed silicon germanium generates defects by relaxation of the silicon germanium lattice strain and/or the injection of silicon interstitials when the germanium is substitutionally incorporated into the lattice. These defects serve to getter unwanted impurities.

One aspect of this disclosure relates to a method for creating proximity gettering sites in a silicon on insulator (SOI) wafer. In various embodiments of this method, a relaxed silicon germanium region is formed over an insulator region of the SOI wafer to be proximate to a device region on the SOI wafer. The relaxed silicon germanium region generates defects to getter impurities from the device region.

One aspect of this disclosure relates to a method for forming a semiconductor structure. A relaxed silicon germanium gettering region is formed over an insulator region of a silicon on insulator (SOI) wafer to be proximate to a device region. Subsequent semiconductor fabrication processes are performed, including processes to fabricate a semiconductor device in the device region. Defects generated by the relaxed silicon germanium gettering region getters unwanted impurities from the device region during the subsequent semiconductor fabrication processes.

One aspect of this disclosure relates to a method for forming a transistor. A proximity gettering region is formed to be proximate to a crystalline silicon region in a wafer. The proximity gettering region includes relaxed silicon germanium over an insulator region of a silicon on insulator (SOI) wafer. A gate dielectric is formed over the crystalline silicon region, and a gate is formed over the gate dielectric. A first diffusion region and a second diffusion region are formed in the strained crystalline silicon region. The first and second diffusion regions are separated by a channel region formed in the crystalline silicon region between the gate and the proximity gettering region. In various embodiments, the crystalline silicon region is sufficiently thin and is positioned on the silicon germanium such that a lattice mismatch strains the crystalline silicon region. In various embodiments, the crystalline silicon region is sufficiently thick such that the crystalline silicon region is not strained. Aspects of this disclosure incorporate such transistors into memory cells and/or control circuitry of memory devices.

These and other aspects, embodiments, advantages, and features will become apparent from the following description and the referenced drawings.

DETAILED DESCRIPTION

The following detailed description refers to the accompanying drawings which show, by way of illustration, specific aspects and embodiments in which the present invention may be practiced. The various embodiments are not necessarily mutually exclusive as aspects of one embodiment can be combined with aspects of another embodiment. Other embodiments may be utilized and structural, logical, and electrical changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The terms "horizontal" and "vertical", as well as prepositions such as "on", "over" and "under" are used in relation to the conventional plane or surface of a wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

A relaxed silicon germanium region or layer is formed to be proximate to a device area in a silicon on insulator (SOI) device such that defects generated by the relaxed silicon germanium getter impurities from the device area even with the small thermal budgets associated with modern low temperature processes. The silicon germanium proximity gettering region is formed over the insulator proximate to the device area. The defects generated by relaxation of the silicon germanium lattice strain and/or the injection of silicon interstitials when the germanium is substitutionally incorporated into the lattice serves to getter unwanted impurities. In various embodiments, a silicon device region is positioned over the silicon germanium.

Figure 1:
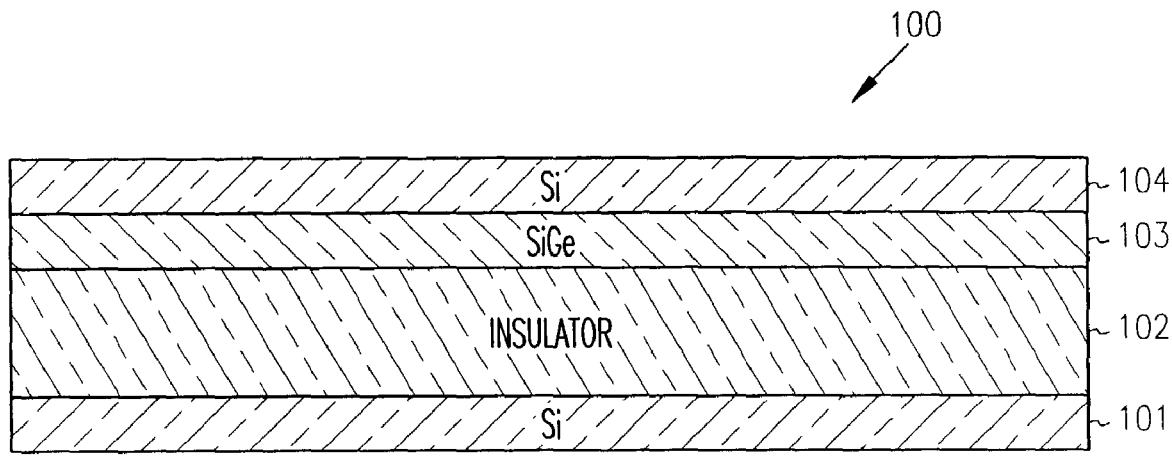
FIG. 1 illustrates a silicon on insulator structure having an epitaxial silicon germanium (SiGe) proximity gettering region over the insulator according to various embodiments of the present invention.
Figure 2:
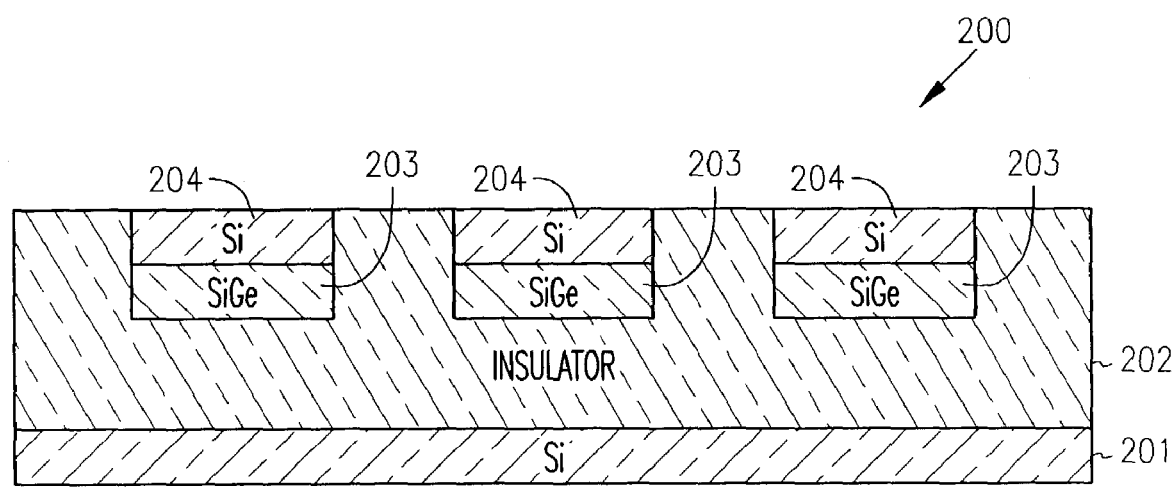
FIG. 2 illustrates a silicon on insulator structure having a number of islands over the insulator with each island including silicon on an epitaxial silicon germanium proximity gettering region according to various embodiments of the present invention.

Various embodiments of the present invention can be incorporated into various SOI structures. In various embodiments, as illustrated in FIG. 1, a wafer includes a single insulator region with a silicon germanium region over the insulator region, and a silicon device region over the silicon germanium region. In various embodiments, as illustrated in FIG. 2, the wafer includes an insulator, and islands of silicon and silicon germanium. In various embodiments, not expressly shown in the figures, the wafer includes a number of local insulator regions, and further includes a silicon and silicon germanium structure over each local insulator region.

FIG. 1 illustrates a silicon on insulator structure having an epitaxial silicon germanium (SiGe) proximity gettering region over the insulator according to various embodiments of the present invention. The illustrated structure 100 includes a silicon wafer, also referred to here as a substrate 101. An insulator 102, such as an oxide ($SiO_2$), is illustrated over the substrate 101. A proximity gettering region 103 is located near to a device region 104 such that unwanted impurities can travel a short distance from the device region 104 to the gettering region 103, even with modem low temperature processes. In various embodiments, the device region 104 includes crystalline silicon. Semiconductor devices, such as transistors, are capable of being fabricated in the crystalline silicon. Thus, it is desired to getter unwanted impurities from the device region. The illustrated proximate gettering region 103 includes an epitaxial relaxed silicon germanium layer. The relaxed silicon germanium layer 103 functions as a proximity gettering region as it generates defects that getter impurities from the device region 104. One of ordinary skill in the art will understand, upon reading and comprehending this disclosure, how to fabricate the illustrated structure.

FIG. 2 illustrates a silicon on insulator structure having a number of islands over the insulator with each island including silicon on an epitaxial silicon germanium proximity gettering region according to various embodiments of the present invention. The illustrated structure 200 includes a semiconductor wafer, also referred to here as a substrate 201. An insulator 202, such as an oxide ($SiO_2$), is illustrated over the substrate 201. A number semiconductor islands are illustrated. Each island includes a proximity gettering region 203 and a device region 204 such that unwanted impurities can travel a short distance from the device regions 204 to the gettering regions 203, even with modem low temperature processes. In various embodiments, the device region 305 includes crystalline silicon. Semiconductor devices, such as transistors, are capable of being fabricated in the crystalline silicon. The illustrated proximity gettering regions 203 include silicon germanium. The silicon germanium generates defects that getter impurities from the device regions 204. One of ordinary skill in the art will understand, upon reading and comprehending this disclosure, how to fabricate the illustrated structure.

Figure 3:
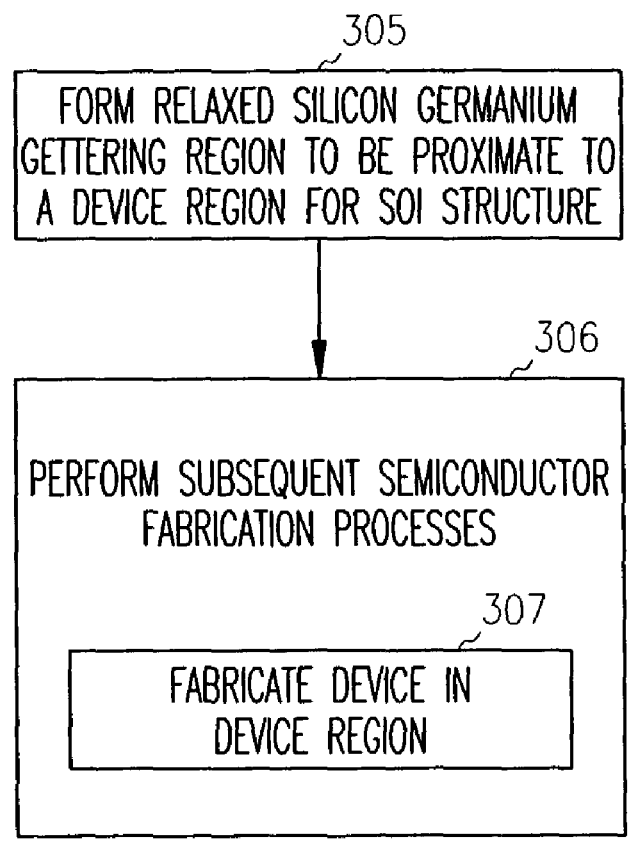
FIG. 3 illustrates a method for forming a semiconductor structure with a proximity gettering region according to various embodiments of the present invention.

FIG. 3 illustrates a method for forming a semiconductor structure with a proximity gettering region according to various embodiments of the present invention. The illustrated method generally includes, at 305 forming a relaxed silicon germanium gettering region to be proximate for a device region in an SOI structure, and at 306 performing subsequent semiconductor fabrication processes such as, at 307 fabricating a device in the device region. The relaxed silicon germanium generates defects that remove unwanted impurities from the device region during the semiconductor fabrication processes. The defects are generated by relaxation of the silicon germanium lattice strain and/or the injection of silicon interstitials when the germanium is substitutionally incorporated into the lattice. Since the gettering region is proximate to the device region and is over the insulator region, the device regions are capable of being gettered even with modem low temperature semiconductor processes.

Figure 4:
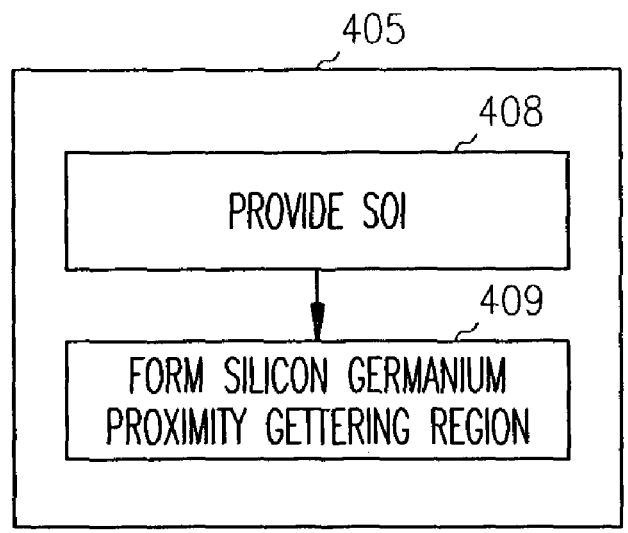
FIG. 4 illustrates a method for forming a relaxed silicon germanium gettering region to be proximate to a device region for a silicon on insulator (SOI) structure according to various embodiments of the present invention.

FIG. 4 illustrates a method for forming a relaxed silicon germanium gettering region to be proximate to a device region for a silicon on insulator (SOI) structure according to various embodiments of the present invention. The illustrated method 405 generally corresponds to 305 in FIG. 3. A silicon on insulator (SOI) structure is provided at 408. A silicon germanium proximity gettering region is formed in the SOI structure at 409. The gettering region includes relaxed silicon germanium that generates defects. In other embodiments, as will be described below with respect to FIG. 13, a relaxed silicon germanium proximity gettering region is formed in a semiconductor wafer, and a local SOI structures are formed by undercutting portions of the semiconductor wafer. In various embodiments, each of these local SOI structures include relaxed silicon germanium.

Figure 5A:
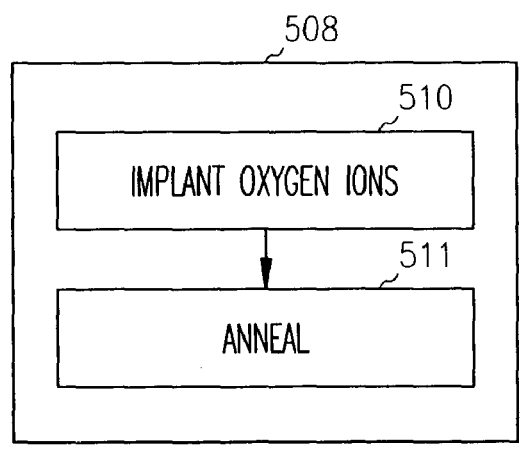
FIGS. 5A-5B illustrate a separation by implantation of oxygen (SIMOX) method for providing SOI according to various embodiments of the present invention.
Figure 5B:
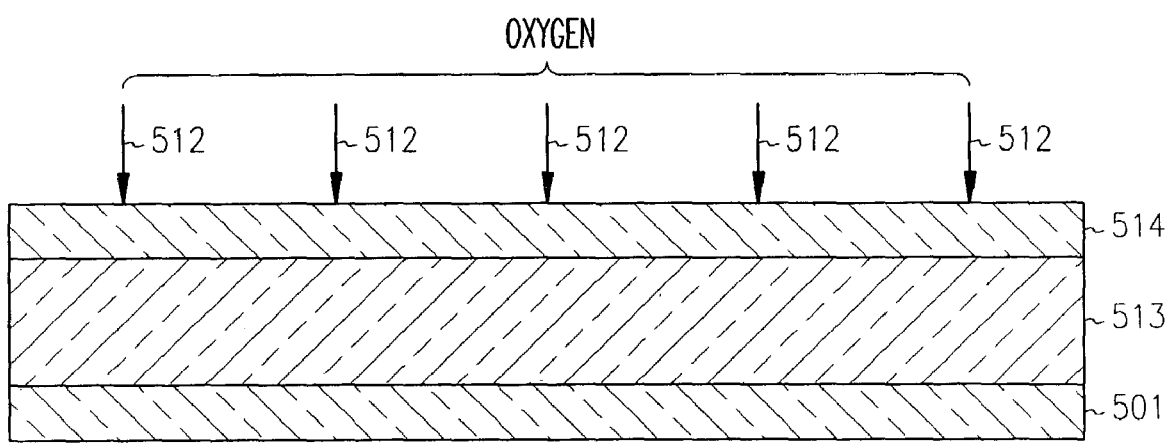

FIGS. 5A-5B illustrate a separation by implantation of oxygen (SIMOX) method for providing SOI according to various embodiments of the present invention. The method 508 illustrated in FIG. 5A generally corresponds to 408 in FIG. 4. Oxygen ions are implanted into the silicon substrate at 510, and the resulting substrate is annealed at 511. Referring to FIG. 5B, the SIMOX process uses a high dose and high energy oxygen implant 512 into a silicon substrate 501 followed by a heat treatment to provide oxide growth and form a buried oxide (BOX) region 513. The BOX region 513 is typically 3000 Å thick or thicker and the silicon layer 514 over the BOX region is typically 1000 Å or thicker when the SIMOX process has been used. In various embodiments, a Separation by Plasma Implantation of Oxygen (SPIMOX) process is used to form shallower oxygen implants. The resulting structure is a silicon on insulator (SOI) structure. As illustrated at 409 in FIG. 4, relaxed silicon germanium gettering regions are capable of being formed in the SOI structure.

Figure 6A:
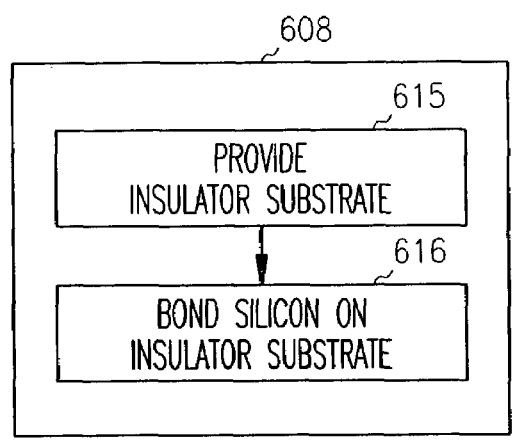
FIGS. 6A-6B illustrate a bonding method for providing SOI according to various embodiments of the present invention.
Figure 6B:
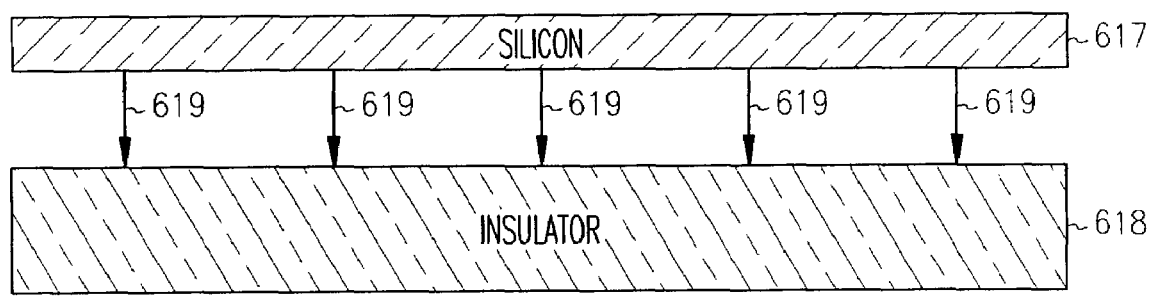

FIGS. 6A-6B illustrate a bonding method for providing SOI according to various embodiments of the present invention. The method 608 illustrated in FIG. 6A generally corresponds to 408 in FIG. 4. An insulator substrate is provided at 615. In various embodiments, the entire substrate includes an insulator material. In various embodiments, a top portion of the substrate includes an insulator such that the substrate is capable of performing an insulator function. Silicon is bonded to the insulator substrate at 616. FIG. 6B illustrates a silicon layer 617, such as a silicon wafer or a portion thereof, being bonded to the insulator substrate 618. The bonding force between the silicon layer 617 and insulator substrate 618 is generally represented by arrows 619. The resulting structure is a silicon on insulator (SOI) structure. As illustrated at 409 in FIG. 4, relaxed silicon germanium gettering regions are capable of being formed in the SOI structure.

FIGS. 7A-7E illustrate a bond cut method for providing SOT according to various embodiments of the present invention. Some literature refers to a bond cut process as a Smart Cut. The method 708 illustrated in FIG. 7A generally corresponds to 408 in FIG. 4. An insulator substrate is provided at 720. In various embodiments, the entire substrate includes an insulator material. In various embodiments, a top portion of the substrate includes an insulator such that the substrate is capable of performing an insulator function. A silicon sacrificial wafer is provided at 721. The silicon sacrificial wafer includes crystalline silicon suitable for use in fabricating devices. At 722, a silicon wafer is formed or defined in a surface layer of the sacrificial wafer. At 723, the surface layer of the sacrificial wafer is bonded to the insulator substrate. The remaining portion of the sacrificial wafer is separated from the surface layer at 724 while the silicon wafer, or surface layer, remains bonded to the insulator substrate. The bond cut process is illustrated and described further in FIG. 7B-7E.

Figure 7A:
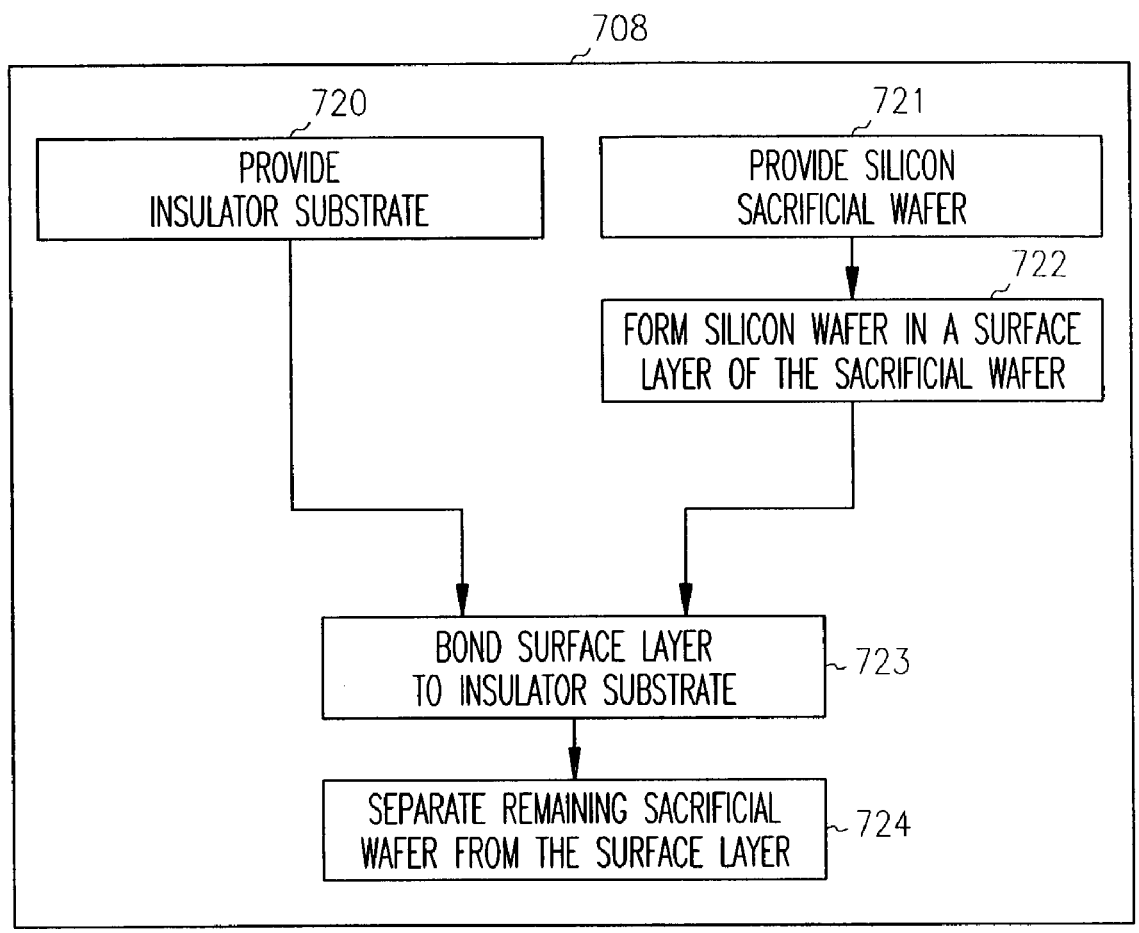
FIGS. 7A-7E illustrate a bond cut method for providing SOT according to various embodiments of the present invention.
Figure 7B:
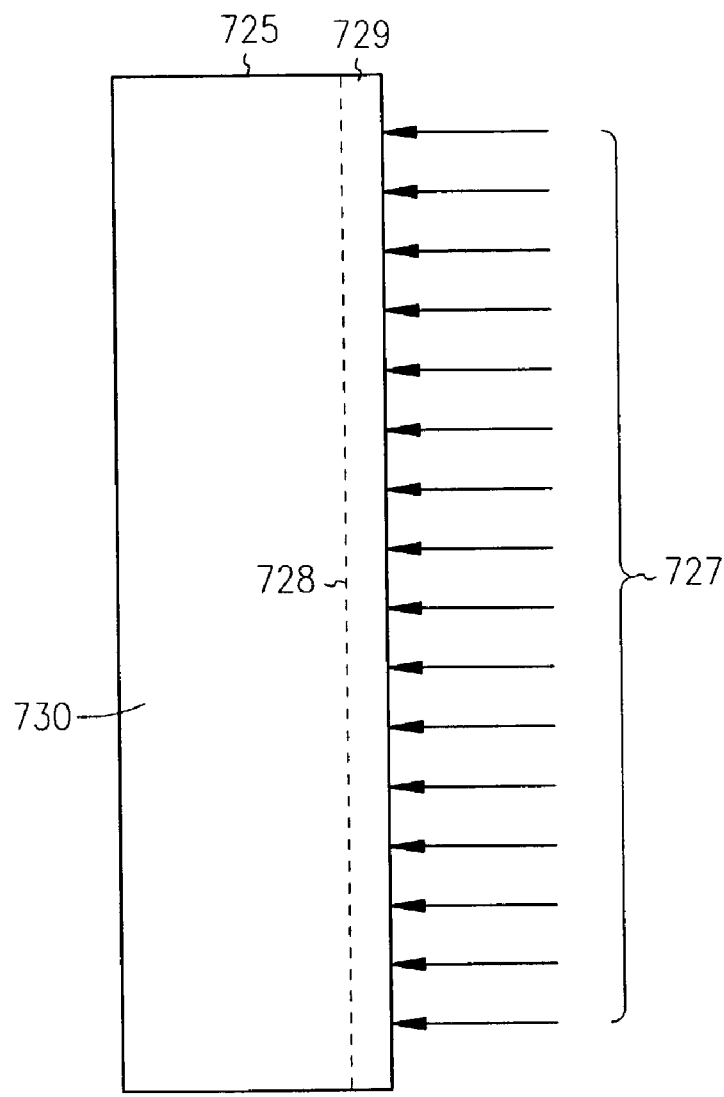
Figure 7C:
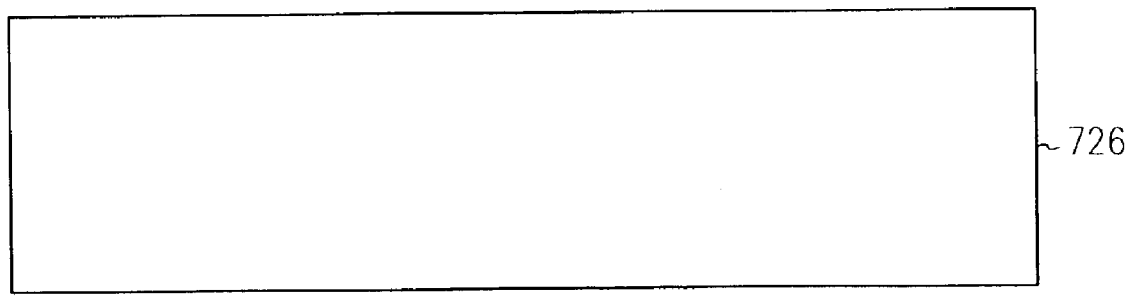

FIG. 7B illustrates a sacrificial semiconductor wafer 725, and FIG. 7C illustrates a semiconductor substrate 726 with an insulator or otherwise illustrates an insulator substrate consistent with a formation of a desired SOI structure. The silicon substrate is cut into wafer size patterns. In various embodiments, the sacrificial wafer includes various semiconductor material including but not limited to silicon, germanium, silicon-germanium, gallium arsenide, indium phosphide, and other semiconductor materials.

Figure 7D:
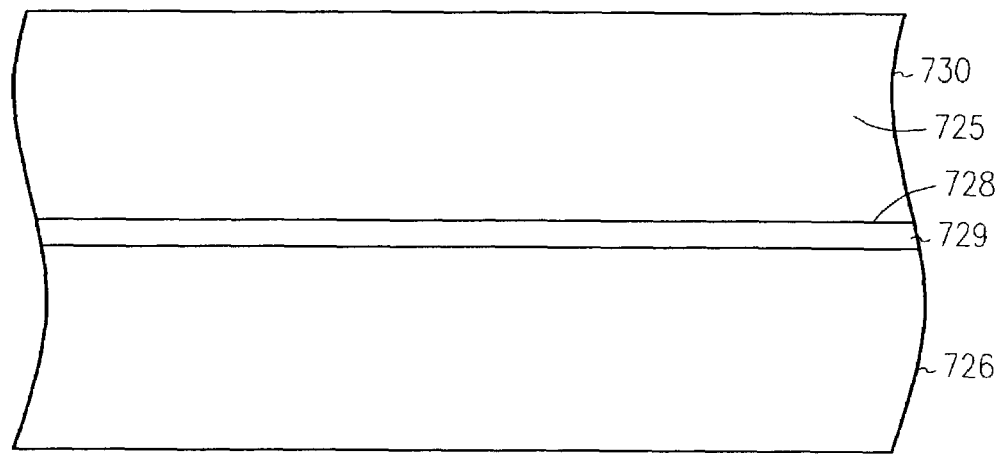

The sacrificial wafer 725 is a single crystal wafer, and is conditioned by implanting ions 727 into a surface. The ions are implanted along a plane, represented in FIG. 7B as a line 728, to define a surface layer 729 with a predetermined thickness. The plane is approximately parallel to the surface in which the ions are implanted. In various embodiments, hydrogen ions are used as implantation ions. The hydrogen ions can include $H^+$, $H_2^+$, $D^+$, and/or $D_2^+$ ions. The implanted ions 727 act to form cavities along the plane 728. The cavities are joined through thermal processing, allowing the surface layer 729 to be removed from the remaining portion of the sacrificial wafer 730 at the cleavage plane 728. In various embodiments, this thermal processing occurs while the surface layer 729 is being bonded to the substrate 726, as shown in FIG. 7D. Once these cavities join and the surface layer is bonded to the substrate, the surface layer breaks off of the sacrificial wafer at the cleavage plane and remains bonded to the substrate. The remaining portion of the sacrificial wafer 730 can be used to form membranes for other substrates, thus reducing waste the overall cost for the manufacturing process of a wide variety of electronic devices.

FIG. 7D illustrates the surface layer 729 of the sacrificial wafer 725 bonded to the substrate 726. Before the surface layer is bonded to the substrate, the sacrificial wafer and the substrate can be cleaned using conventional cleaning procedures. In various embodiments, the bonding force includes the strong Van der Waal's force that naturally bonds surfaces together as the bonding force. In various embodiments, the Van der Waal's force provides an initial bonding force that is strengthened during subsequent thermal processing.

In various embodiments, the bonded wafers are heated to further bond the surface layer to the substrate and to cut the surface layer 729 from the sacrificial wafer 510. In various embodiments, the bonded wafers are heated within a range of approximately 300° C. to 400° C. Heating the sacrificial wafer joins the cavities in the cleavage plane 728, allowing the remaining portion 730 of the sacrificial wafer to be removed from the surface layer, which remains bonded to the substrate 726. The remaining portion 730 of the sacrificial wafer can be prepared and conditioned for another bond cut process.

The thickness of the surface layer 729 bonded to the substrate 726 is defined by the depth of ion implantation 727 during the bond cut process. In various embodiments, the thickness of the surface layer 729 is less than 200 nm, such that it can be termed an ultra thin wafer. In various embodiments, the silicon layer has a thickness of about 0.1 microns (100 nm or 1000 Å). In various embodiments, the silicon layer has a thickness less than 0.1 microns. In various embodiments, the silicon layer has a thickness in a range of approximately 300 Å to 1000 Å.

In various embodiments, the silicon film is prepared for transistor fabrication. In various embodiments, the preparation of the film includes grinding, polishing, chemical etch, chemical etch with etch stops, and/or plasma assisted chemical etch, and the like, which can be used to further thin the film. Thus, the membrane 729 bonded to the substrate 726 illustrated in FIG. 7E can be thinner than the surface layer 729 defined in the sacrificial layer in FIG. 7D by the depth of the ion implantation. Device processing can be accomplished using conventional processes and procedures.

Figure 7E:
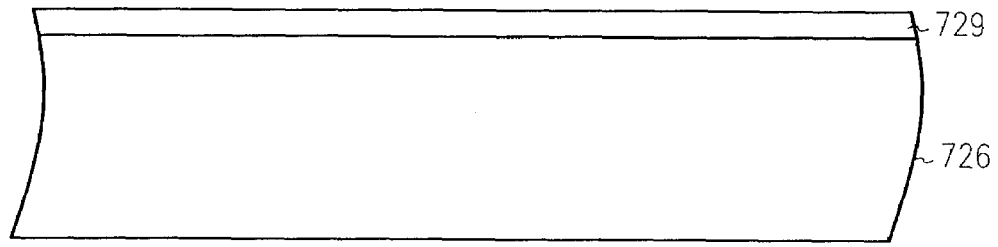

Referring to FIG. 7E where a silicon layer 729 is bonded to an insulator substrate, it is seen that an SOI structure is provided. As illustrated at 409 in FIG. 4, relaxed silicon germanium gettering regions are capable of being formed in the SOI structure.

FIGS. 8A-8E illustrate an undercut method for providing SOI islands according to various embodiments of the present invention. The method 808 illustrated in FIG. 8A generally corresponds to 408 in FIG. 4. A silicon wafer is provided at 831. At 832, trenches are formed in the silicon wafer. At 833, islands are undercut by a chemical etch and oxidation process. Examples of an undercut method are described in U.S. Pat. Nos. 5,691,230 and 6,204,145. Both the '230 and '145 patent are assigned to applicant's assignee and are incorporated herein by reference in their entirety. The undercut method is illustrated and described further in FIG. 8B-8E.

Figure 8A:
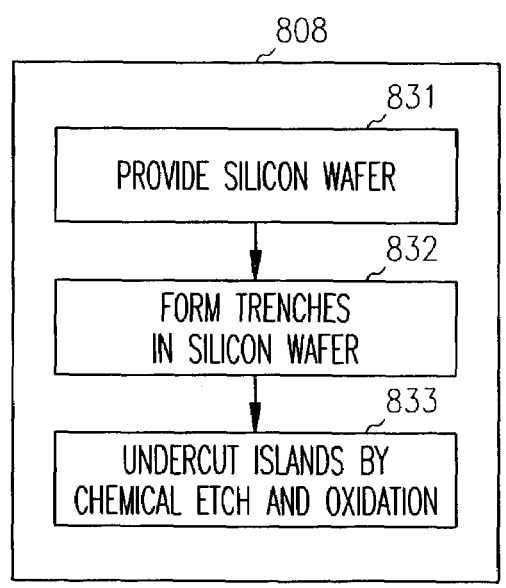
FIGS. 8A-8E illustrate an undercut method for providing SOI islands according to various embodiments of the present invention.
Figure 8B:
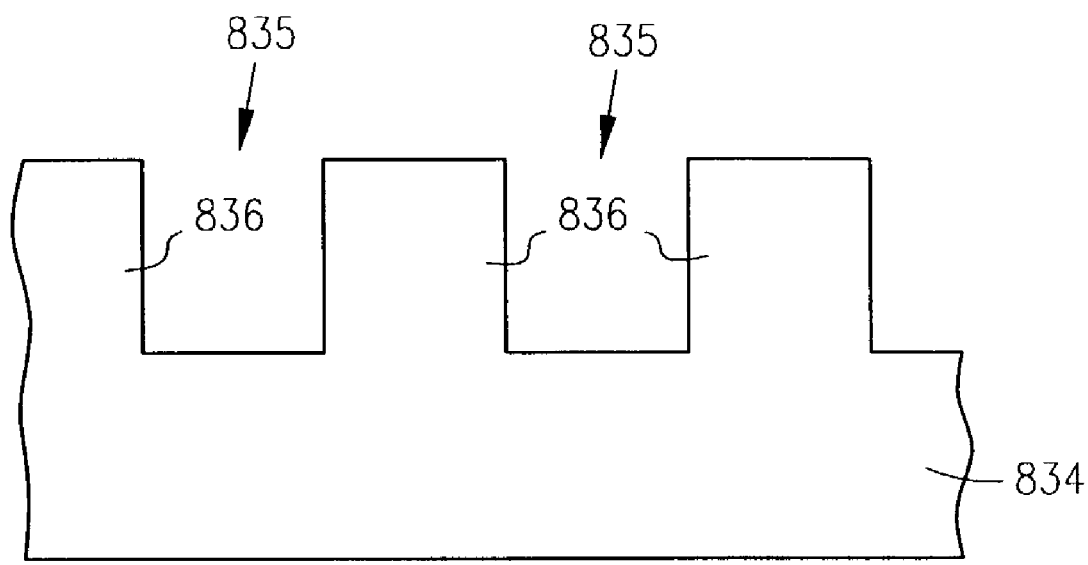

As shown in the illustrated embodiment in FIG. 8B, a silicon substrate 834 is directionally-etched to form trenches 835, leaving rows 836 of silicon protruding from the substrate. The direction of the etch varies with the crystal orientation of the substrate. In various embodiments, the etch direction is orthogonal to the plane of the substrate. In various embodiments, the substrate is oxidized at a temperature of approximately 900° C. to 1,100° C., covered with silicon nitride ($Si_3N_4$) masked and etched to form exposed oxide regions using standard techniques. The exposed oxide regions are etched away with a direction etchant, such as a reactive ion etch (RIE), forming trenches in the substrate.

Figure 8C:
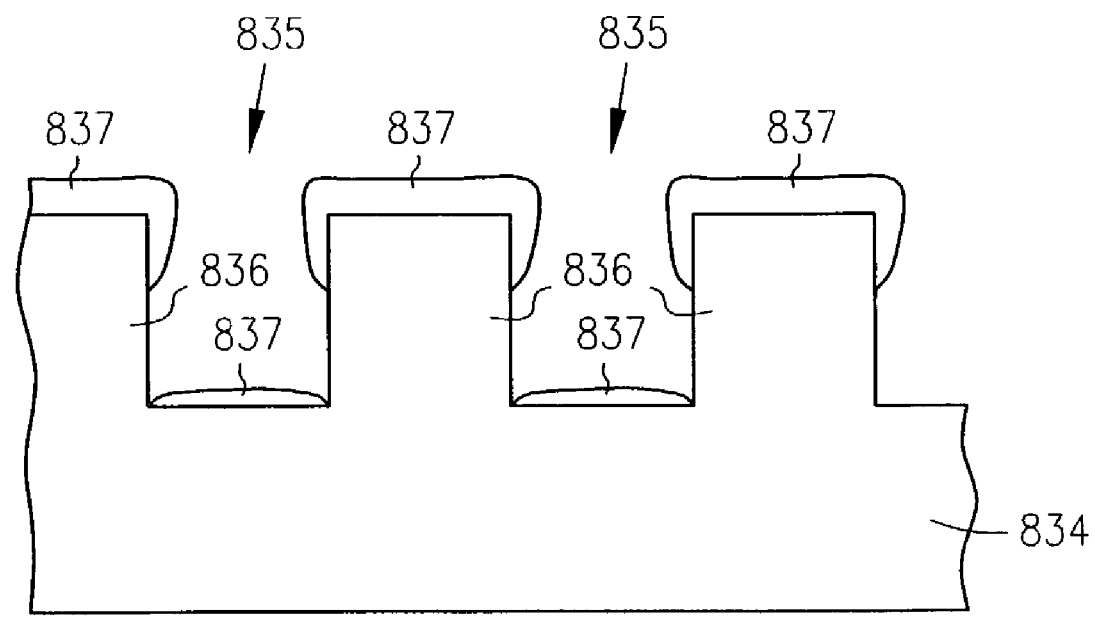

As shown in the illustrated embodiment in FIG. 8C, a silicon nitride cap 837 is formed on the silicon rows 836. The silicon nitride is deposited on over the structure, using techniques such as chemical vapor deposition (CVD) and the like. Silicon nitride forms on the tops of the silicon rows and partly down the sides of the trenches. Material overhang at the top of the trenches prevents silicon nitride from covering the lower sides of the trenches. Some silicon nitride is deposited onto the bottom of the trenches.

Figure 8D:
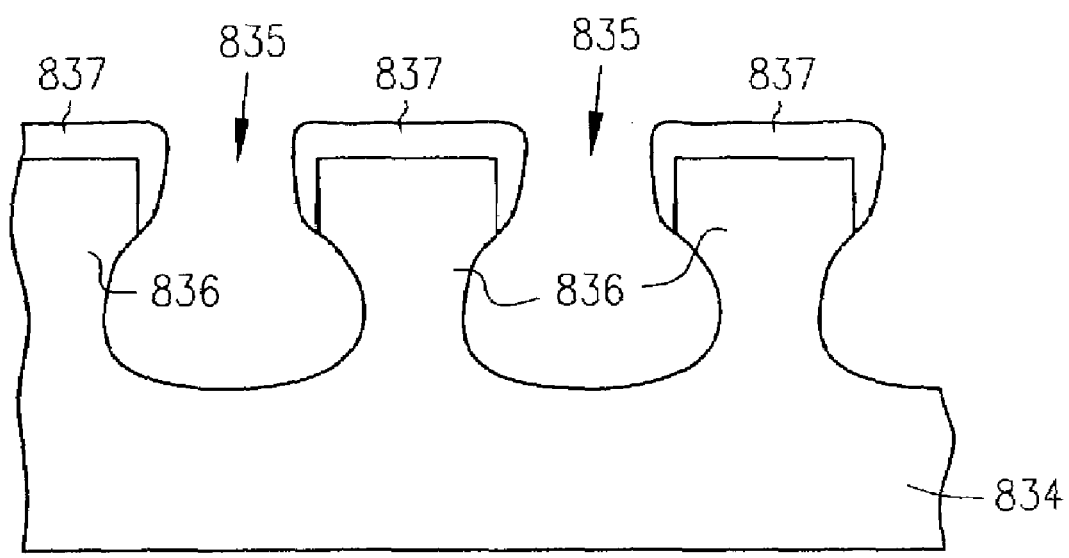

A photoresist mask is used to cover the silicon rows and an etch is used to remove residual silicon nitride on the bottom of the trenches. An isotropic chemical etch is used to partially undercut the rows 836 of silicon, as shown in FIG. 8D. Standard etches can be used for the isotropic etchant, which compensates for the volume of oxide to be formed in the next step. In general, the volume of oxide formed is approximately twice that of the silicon consumed. Partially undercutting the silicon rows, reduces the effective width of the rows to a distance small enough that a relatively short, simple oxidation can fully undercut the silicon rows. Fully undercutting the rows of silicon is possible because the width of the rows are typically one micron or less.

Figure 8E:
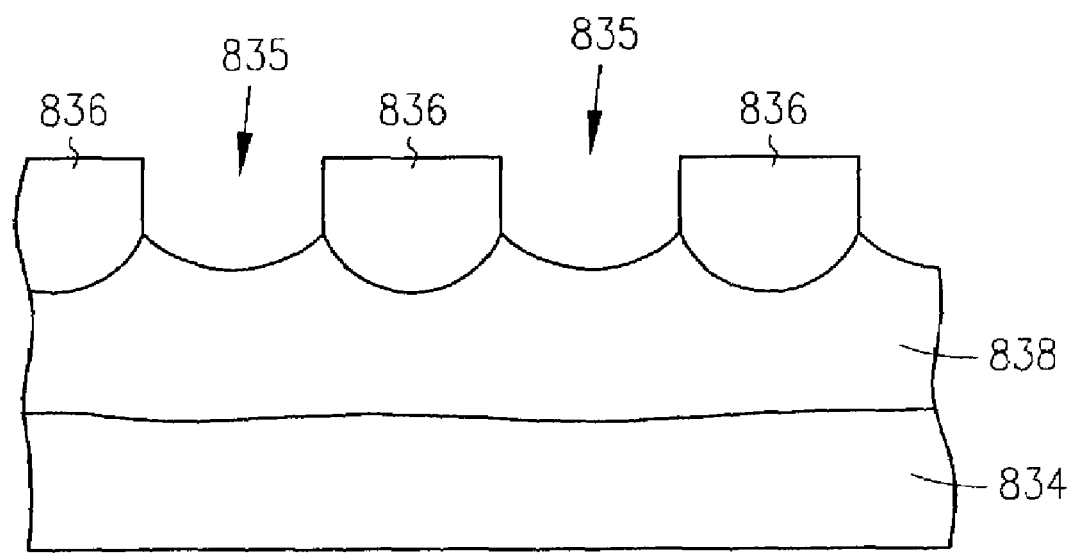

The substrate is oxidized at a temperature of approximately 900° C. to 1,100° C., as shown in the illustrated embodiment in FIG. 8E. A wet, oxidizing ambient is used in the furnace chamber to oxidize the exposed silicon regions on the lower part of the trenches in a parallel direction to the surface of the substrate. The substrate is oxidized for a time period, such that oxide 838 fully undercuts the bottom of the silicon rows leaving isolated silicon rows. The time period for oxidation depends on the width of the rows and the effective width after the partial undercut step. As the desired size of the silicon decrease, so does the required oxidation time. As illustrated at 409 in FIG. 4, relaxed silicon germanium gettering regions are capable of being formed in the SOI structure.

Figure 9A:
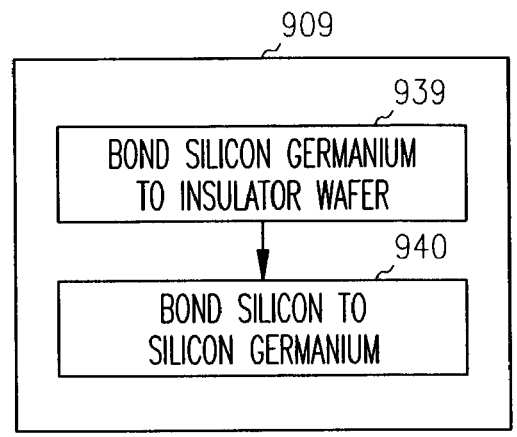
FIGS. 9A-9B illustrate a bonding method for forming a silicon germanium proximity gettering region according to various embodiments of the present invention.
Figure 9B:
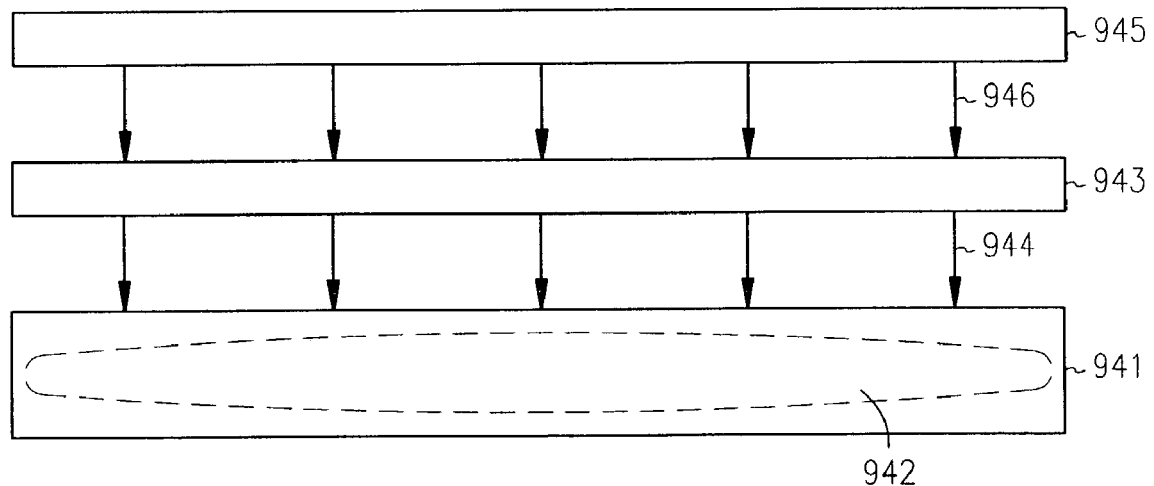

FIGS. 9A-9B illustrate a bonding method for forming a silicon germanium proximity gettering region according to various embodiments of the present invention. The method 909 illustrated in FIG. 9A generally corresponds to 408 and 409 in FIG. 4. At 939, silicon germanium is bonded to an insulator wafer. The insulator wafer can include an entire wafer formed of an insulator, or include an insulator portion. In various embodiments, the silicon germanium is bonded to an insulator region in the wafer; and in various embodiments, the silicon germanium is bonded to a semiconductor region positioned over an insulator region. At 940, silicon is bonded to the silicon germanium. The silicon germanium forms a proximate gettering region to getter impurities from the silicon. Referring to FIG. 9B, a wafer 941 is provided that includes an insulator region 942, which is generally illustrated by the dotted line. In various embodiments, the entire wafer is an insulator, such as a glass. In various embodiments, a portion of the wafer includes an insulator region, such as an oxide. A silicon germanium layer 943 is bonded to the wafer by a bonding force, as represented by arrows 944. A silicon layer 945 is bonded to the silicon germanium layer 943 by a bonding force 946, as represented by the arrows.

Figure 10A:
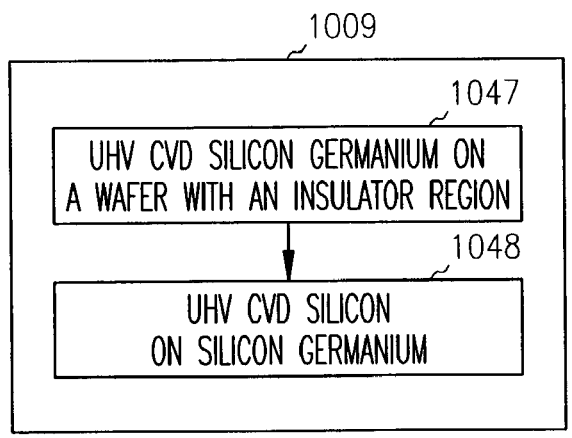
FIGS. 10A-10C illustrate an ultra high vacuum chemical vapor deposition (UHV CVD) method for forming a silicon germanium proximity gettering region according to various embodiments of the present invention.
Figure 10B:
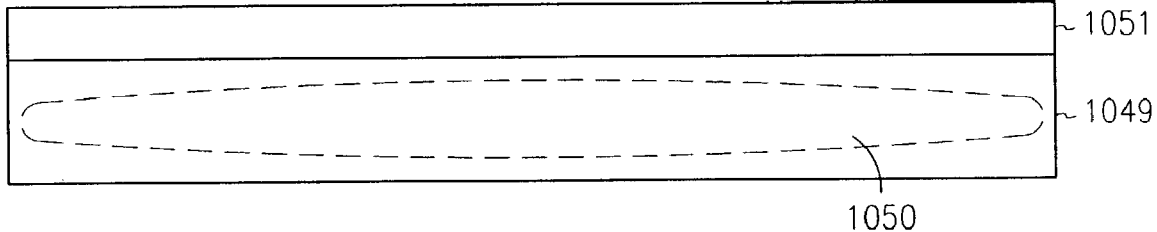
Figure 10C:
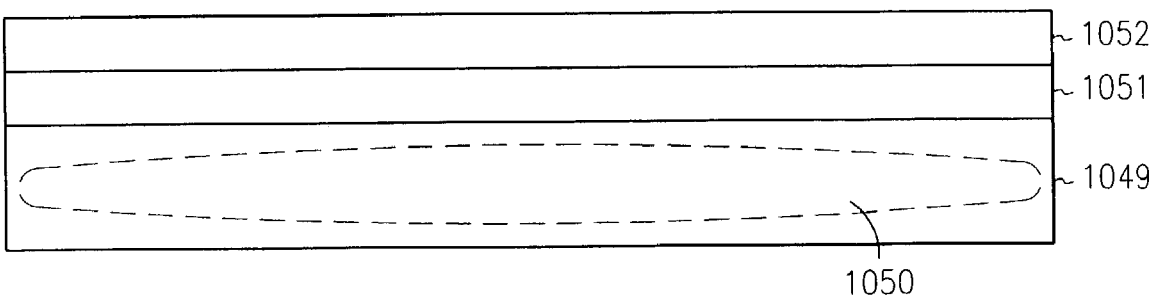

FIGS. 10A-10C illustrate an ultra high vacuum chemical vapor deposition (UHV CVD) method for forming a silicon germanium proximity gettering region according to various embodiments of the present invention. The method 1009 illustrated in FIG. 10A generally corresponds to 408 and 409 in FIG. 4. At 1047, silicon germanium is deposited or grown on a wafer with an insulator region using a process such as Ultra High Vacuum Chemical Vapor Deposition (UHV CVD) process. At 1048, silicon is deposited or grown on silicon germanium using a process such as UHV CVD. The silicon germanium forms a proximate gettering region to getter impurities from the silicon. Referring to FIG. 10B, a wafer 1049 is provided that includes an insulator region 1050, which is generally illustrated by the dotted line. In various embodiments, the entire wafer is an insulator, such as glass. In various embodiments, a portion of the wafer includes an insulator region, such as an oxide. A silicon germanium layer 1051 is grown on the wafer 1049. Referring to FIG. 10C, a silicon layer 1052 is grown to the silicon germanium layer 1051.

FIGS. 11A-11H illustrate a germanium implant and solid phase epitaxial (SPE) method for forming a silicon germanium proximity gettering region according to various embodiments of the present invention. The method 1109 illustrated in FIGS. 11A and 11B generally corresponds to 409 in FIG. 4. At 1153, germanium ions are implanted into a silicon region of an SOI structure 1155, such as a p-type silicon for an n-channel device and an n-type silicon for a p-channel device. In various embodiments, the dose of the germanium ion implant is approximately $10^{20}/cm^2$, and the energy of the germanium ion implant is greater than 200 KeV. At 1154, the substrate is heat treated to perform a solid phase epitaxial (SPE) regrowth. The germanium ion implant is illustrated by arrows 1156 in FIG. 11B. The illustrated method is used in a process to form an SOI device with a relaxed epitaxial silicon germanium proximity gettering layer according to various embodiments of the present invention. The relaxed silicon germanium gettering region is formed proximate to a device region. The implant forms a silicon region containing germanium ions beneath a silicon layer, and amorphizes, or at least partially amorphizes, the silicon layer over the silicon region containing germanium ions. Germanium ions are implanted into a silicon substrate with a desired dose and energy to form the silicon region containing germanium ions. The implantation of the germanium ions also amorphizes, or at least partially amorphizes, the silicon layer over the silicon region containing germanium ions. This amorphized silicon layer is recrystallized to serve as a device region. Thus, it is desired to remove unwanted impurities from the silicon layer. A heat treatment is used to perform a solid phase epitaxy (SPE) growth process to form a crystalline silicon layer from the amorphized silicon over a silicon germanium region, and to transform the silicon region containing germanium ions into relaxed silicon germanium. Defects generated by the relaxed silicon germanium proximity layer getter impurities from the crystalline silicon layer. In various embodiments, the crystalline silicon layer is sufficiently thin such that the lattice mismatch between the crystalline silicon layer and the silicon germanium gettering region causes the crystalline silicon layer to be strained. A device is formed using the strained silicon layer such that the device has enhanced carrier mobility. In various embodiments, the crystalline silicon layer is sufficiently thick such that the lattice mismatch between the crystalline silicon layer and the silicon germanium does not cause the crystalline silicon layer to be strained.

Figure 11A:
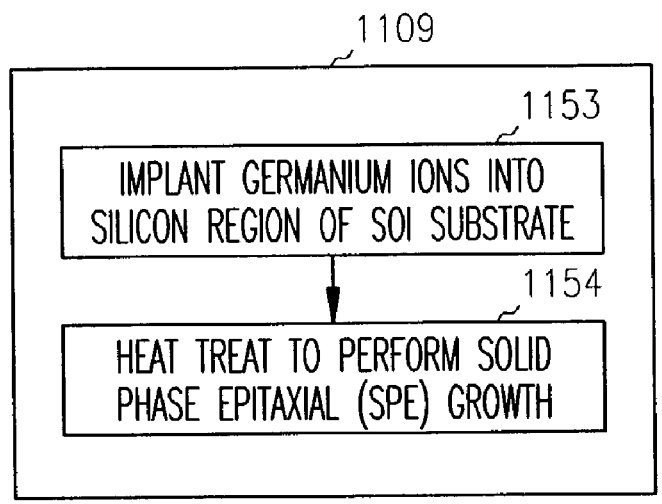
FIGS. 11A-11H illustrate a germanium implant and solid phase epitaxial (SPE) method for forming a silicon germanium proximity gettering region according to various embodiments of the present invention.
Figure 11B:
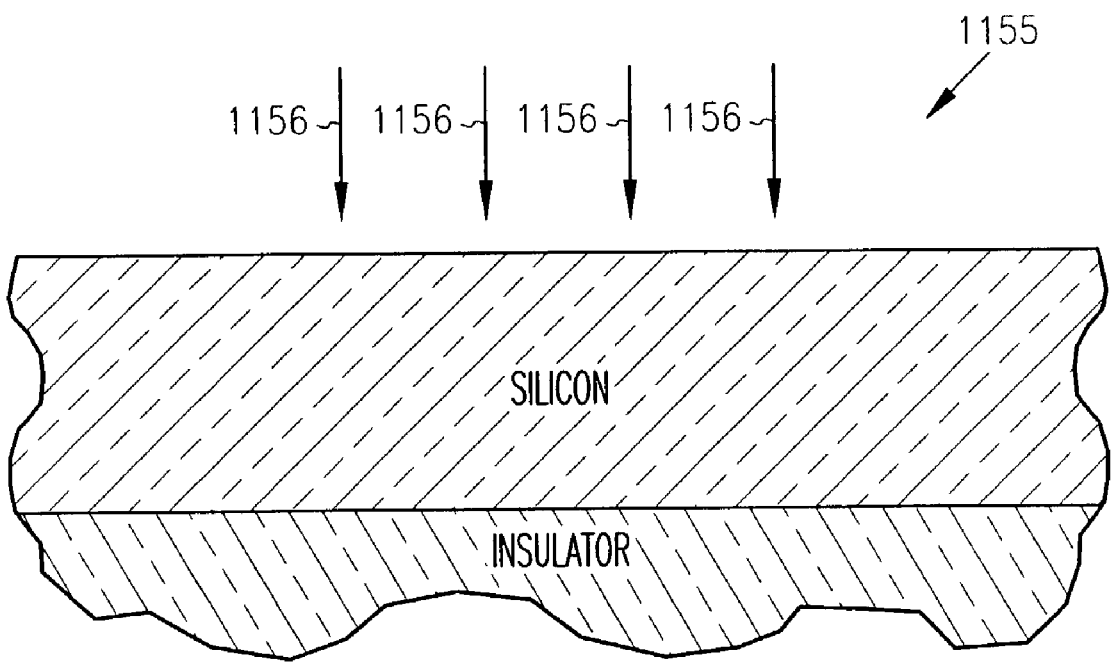
Figure 11C:
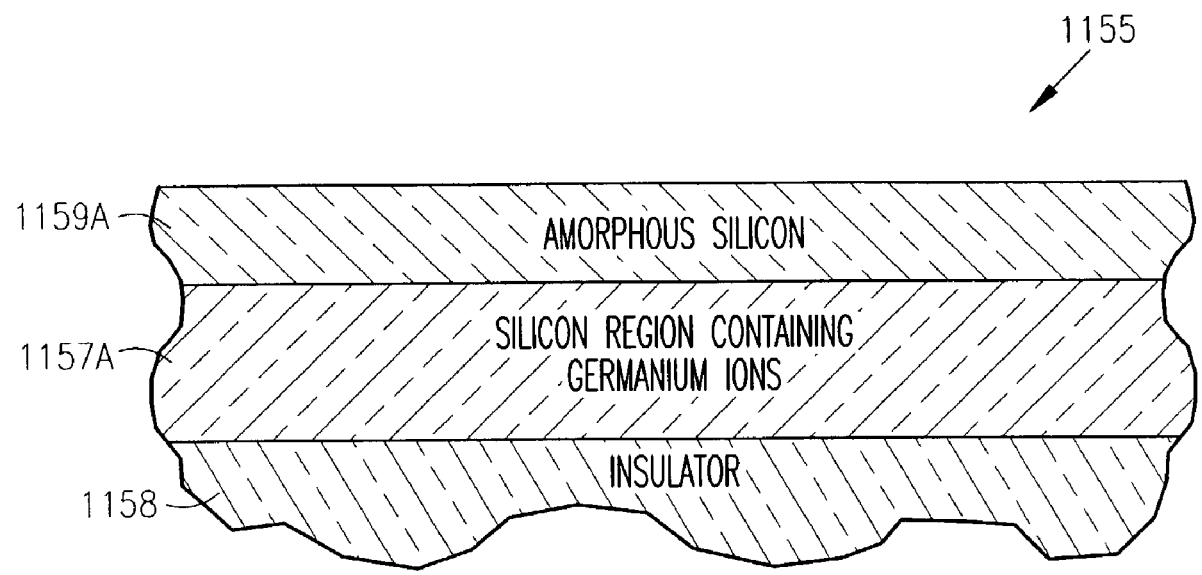

As represented in FIG. 11C, the relatively high dose and energy of the germanium ion implant in the SOI structure 1155 results in a region of silicon that contains germanium ions, represented as 1157A, over the insulator 1158 and further results in an amorphized, or at least a partially amorphized, silicon layer 1159A at the surface. In various embodiments, the region 1157A is in contact with and over the insulator 1158. In various embodiments, the region 1157A is over the insulator 1158, but is not in contact with the insulator 1158.

In various embodiments, if the germanium ion implant did not completely amorphize the surface silicon layer, a silicon ion implant is used to further amorphize the silicon layer. In various embodiments, the dose of this silicon ion implant to amorphize the silicon layer 1159A is approximately $10^{15}/cm^2$ and the energy of this silicon ion implant is greater than approximately 170 KeV.

During an ion implantation process, the ions can channel along the crystal directions of the substrate, such that the ions do not encounter nuclei and are slowed down mainly by electronic stopping. Channeling can be difficult to control, and can cause the ions to penetrate several times deeper than intended. In various embodiments, to avoid channeling during the germanium ion implant, the silicon substrate is amorphized using a silicon ion implant to prepare the substrate for the germanium ion implant. In various embodiments, the dose of this silicon ion implant is approximately $10^{15}/cm^2$ and the energy of this silicon ion implant is greater than 170 KeV. Preparing the substrate using the silicon ion implant to amorphize the substrate results in better depth control during the germanium ion implant process.

Figure 11D:
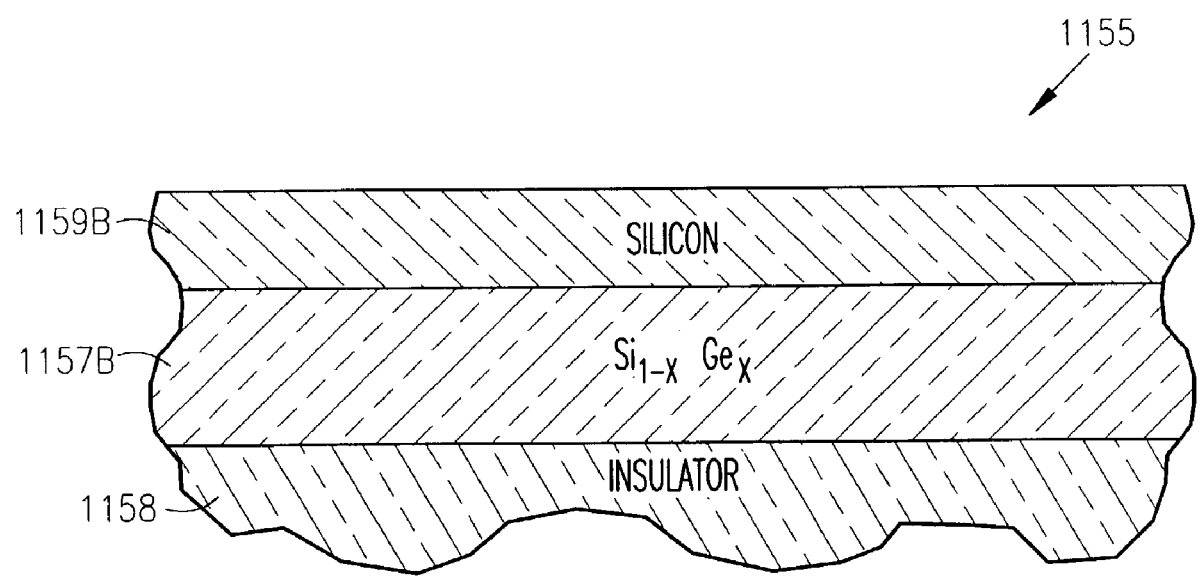

The structure 1155 is heat treated, or annealed, such that the amorphized layers are regrown by a solid phase epitaxy (SPE) process. In various embodiments, the SPE process involves heating the structures at temperatures within a range of approximately 550° C. to 700° C. for a time within a range from approximately one hour to approximately two hours. The resulting structure is illustrated in FIG. 11D. The silicon region that contains germanium ions is transformed into a silicon germanium ($Si_{1-x}Ge_x$) layer 1157B and the amorphous silicon layer is crystallized into a crystalline silicon layer 1159B over the silicon germanium layer 1157B.

In various embodiments, the crystalline silicon layer is approximately 20 nm thick. However, the present invention is not limited to a particular thickness. The thickness of the crystalline silicon layer is controlled by the energy of the implant. One of ordinary skill in the art will understand, upon reading and comprehending this disclosure, how to control the germanium implant to achieve a desired thickness of the crystalline silicon layer 1159B.

The devices are formed in the silicon layer on the silicon germanium gettering layer. One of ordinary skill in the art will understand, upon reading and comprehending this disclosure, that thicker silicon wafers on the relaxed silicon germanium gettering layer are not strained, and thinner silicon wafers on the relaxed silicon germanium gettering layer are strained. For example, ultra thin silicon layers having a thickness of approximately 2000 Å or less are strained by the lattice mismatch with the relaxed silicon germanium gettering layer. In various embodiments, the silicon layer has a thickness of approximately 1000 Å or less. In various embodiments, the silicon layer has a thickness within a range of approximately 300 Å to approximately 1000 Å.

One area of interest for improving the speed and performance of semiconductor devices includes strained silicon technology, which has been shown to enhance carrier mobility in both n-channel and p-channel devices, and is being considered to improve the electron mobility and drift velocity in n-channel MOSFETs in CMOS technology. Thin layers of strained silicon are being considered for CMOS n-channel devices. Thinner layers of silicon are more tolerant of strain. One technique for producing strained silicon involves epitaxially growing the silicon and silicon germanium layers using an ultra-high vacuum chemical vapor deposition (UHV CVD) process, a costly and complex process, to form silicon layers on relaxed silicon germanium layers. A large mismatch in the cell structure causes a pseudo-morphic layer of silicon on relaxed silicon germanium to be under biaxial tensile strain. The biaxial strain modifies the band structure and enhances carrier transport in the silicon layer. The strain on the silicon layer depends of the lattice constant difference between silicon and silicon germanium. The lattice constant of silicon germanium is between the lattice constant of silicon (5.43095 Å) and the lattice constant of germanium (5.64613 Å), and depends on the percentage of germanium in the silicon germanium layer.

Upon reading and comprehending this disclosure, one of ordinary skill in the art will appreciate the benefits of strained silicon. The strained silicon layer improves the electron mobility in the n-channel transistors in CMOS technology. A pseudo-morphic layer of silicon on relaxed silicon germanium is under biaxial tensile strain, which modifies the band structure and enhances carrier transport. In an electron inversion layer, the subband splitting is large in strained silicon because of the strain-induced band splitting in addition to that provided by quantum confinement. The ground level splitting in a MOS inversion layer at 1 MV/cm transverse field is about 120 and 250 meV for unstrained and strained silicon, respectively. The increase in energy splitting reduces inter-valley scattering and enhances NMOSFET mobility, as demonstrated at low (<0.6 MV/cm) and higher (approximately 1 MV/cm) vertical fields. The scaled $g_m$ is also improved due to the reduced density of states and enhanced non-equilibrium transport. The germanium content can be graded in steps to form a fully relaxed silicon germanium buffer layer before a thin strained silicon channel layer is grown. X-ray diffraction analysis is used to quantify the germanium content and strain relaxation in the silicon germanium layer. The strain state of the silicon channel layer can be confirmed by Raman spectroscopy.

The lattice mismatch of the silicon surface layer with the underlying silicon germanium layer 1157B causes the silicon layer 1159B to be strained. In various embodiments, N-channel CMOS devices are fabricated in this strained silicon layer 1159B using conventional techniques, which are not described here for the sake of brevity.

One of ordinary skill in the art will understand, upon reading and comprehending this disclosure, that the concentration (X) of germanium in the silicon is controlled by the dose and energy of the germanium ion implant process. Additionally, one of ordinary skill in the art will understand, upon reading and comprehending this disclosure, that the concentration (X) of germanium in the silicon can be graded by controlling the dose and energy of two or more germanium ion implant process. A benefit of grading germanium concentration involves forming a silicon germanium layer on a silicon substrate to have a relaxed silicon germanium surface upon which the crystalline silicon layer is regrown.

Figure 11E:
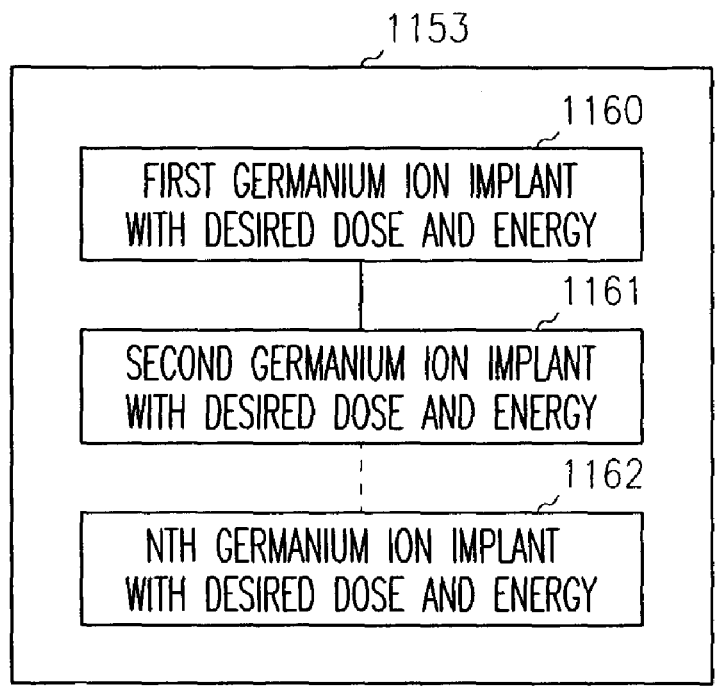

FIG. 11E illustrates a method for amorphizing the silicon layer and forming a silicon germanium layer beneath the silicon layer, according to various embodiments of the present invention. The illustrated method is represented generally at 1153, which generally corresponds to 1153 in FIG. 11A. At 1160, a first germanium ion implant is performed with a first desired dose and energy. At 1161, a second germanium ion implant is performed with a second desired dose and energy. Additional germanium implants can be performed according to various embodiments. Thus, the figure illustrates, at 1162, an Nth germanium ion implant performed with an Nth desired does and energy. The illustrated method is useful to create a silicon region with a graded concentration of germanium ions, such that upon annealing, a resulting silicon germanium layer has a desired graded germanium concentration.

Figure 11F:
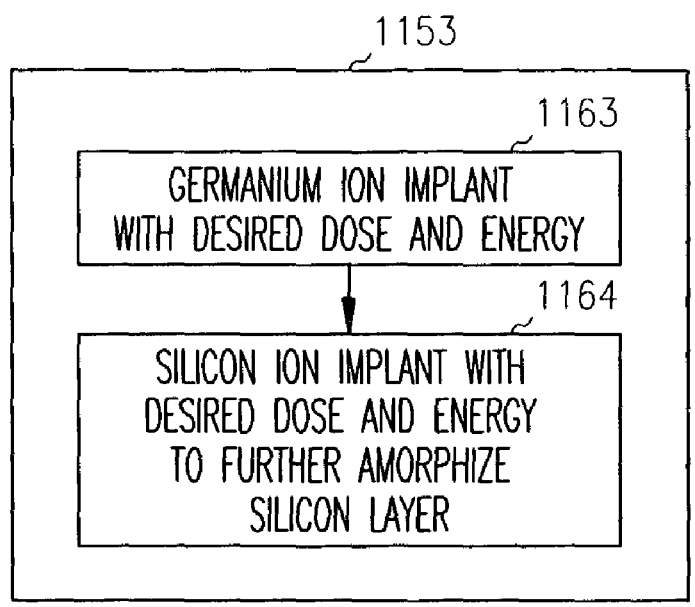

FIG. 11F illustrates a method for forming a silicon region containing germanium ions beneath a silicon layer, and amorphizing the silicon layer over the silicon region containing germanium ions, according to various embodiments of the present invention. The illustrated method is represented generally at 1153, which generally corresponds to 1153 in FIG. 11A. At 1163, a germanium ion implant is performed with a desired dose and energy to form a silicon region containing germanium ions within a silicon substrate. This germanium ion implant partially amorphizes the silicon layer positioned over the silicon region containing germanium ions. At 1164, a silicon ion implant is performed with a desired dose and energy to further amorphize the silicon layer in preparation for the SPE growth process, illustrated at 1154 in FIG. 11A.

Figure 11G:
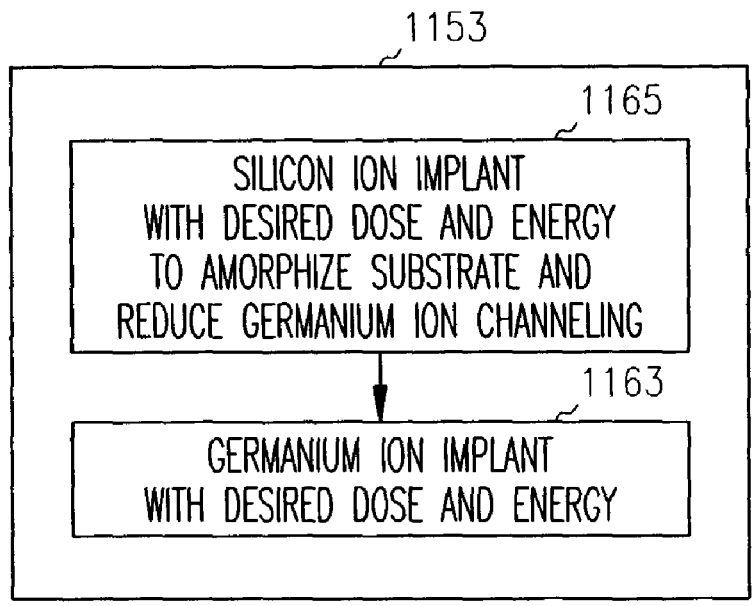

FIG. 11G illustrates a method for forming a silicon region containing germanium ions beneath a silicon layer, and amorphizing the silicon layer over the silicon region containing germanium ions, according to various embodiments of the present invention. The illustrated method is represented generally at 1153, which generally corresponds to 1153 in FIG. 11A. At 1165, a silicon ion implant is performed with a desired dose and energy to prepare the silicon substrate for germanium ion implantation. The silicon ion implant amorphizes the silicon substrate to a desired depth to reduce channeling of the germanium ions. At 1163, a germanium ion implant is performed with a desired dose and energy to form a silicon region containing germanium ions within the amorphized silicon substrate. Reducing the unpredictable channeling by amorphizing the substrate permits better control of the depth of the germanium ion implant.

Figure 11H:
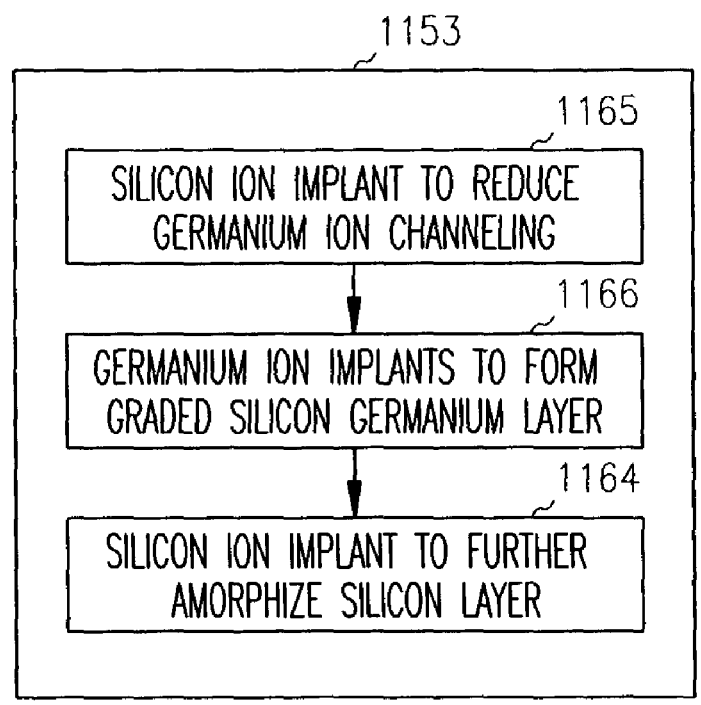

FIG. 11H illustrates a method for forming a silicon region containing germanium ions beneath a silicon layer, and amorphizing the silicon layer over the silicon region containing gennanium ions, according to various embodiments of the present invention. The illustrated method is represented generally at 1153, which generally corresponds to 1153 in FIG. 11A. At 1165, a first silicon ion implant is performed with a desired dose and energy to prepare the silicon substrate for germanium ion implantation. The silicon ion implant amorphizes the silicon substrate to a desired depth to reduce channeling of the germanium ions. At 1166, a number of germanium ion implant steps are performed to create a silicon region with a graded concentration of germanium ions in the amorphized silicon substrate, such that upon annealing, a resulting silicon germanium layer has a desired graded germanium concentration. The first silicon implant reduces the unpredictable channeling and permits better control of the depth of the germanium ion implants These germanium ion implant steps at least partially amorphizes the silicon layer positioned over the silicon region containing germanium ions. At 1164, a second silicon ion implant is performed with a desired dose and energy to further amorphize the silicon layer in preparation for the SPE growth process, illustrated at 1154 in FIG. 11A.

Figure 12A:
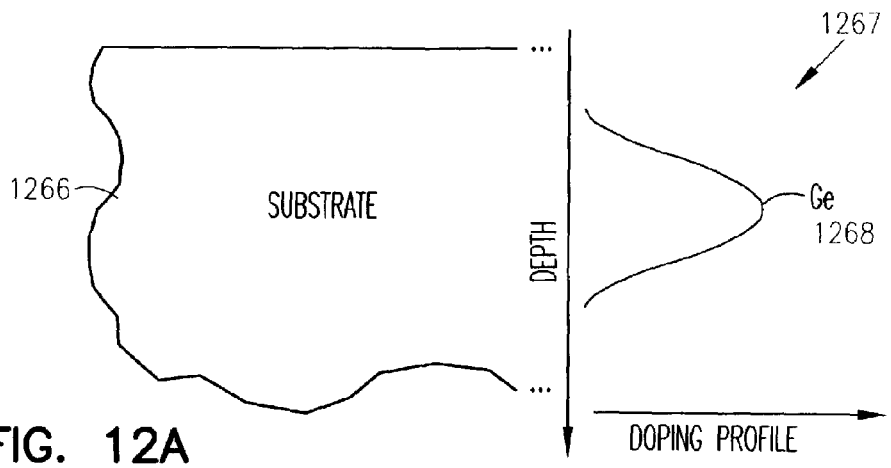
FIG. 12A-12C illustrate various doping profiles used to perform a germanium implant and solid phase epitaxial (SPE) method to form an epitaxial silicon germanium proximity gettering layer according to various embodiments of the present invention.
Figure 12B:
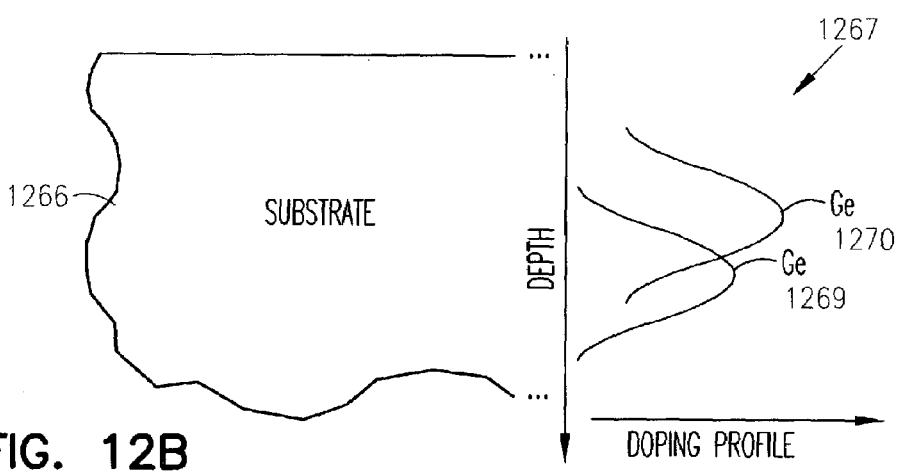
Figure 12C:
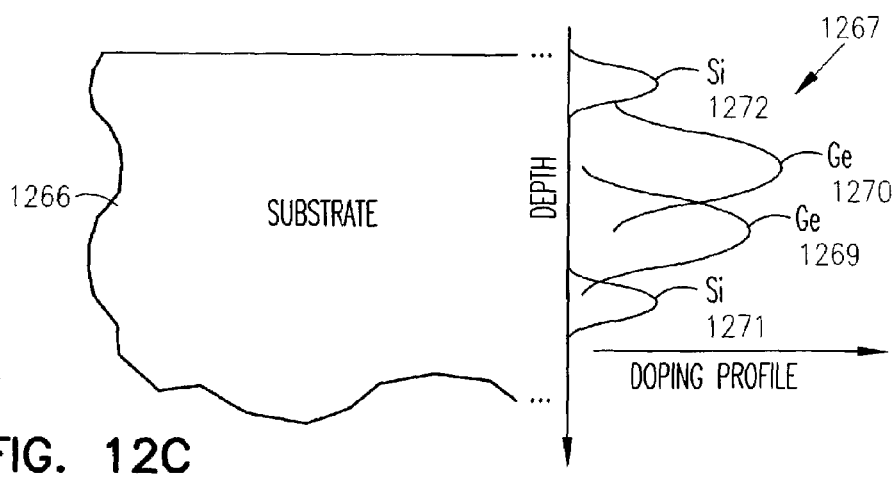

FIG. 12A-12C illustrate various doping profiles used to perform a germanium implant and solid phase epitaxial (SPE) method to form an epitaxial silicon germanium proximity gettering layer according to various embodiments of the present invention. FIG. 12A illustrates a doping profile for forming an epitaxial silicon germanium (SiGe) proximity gettering layer in which a single germanium implant process provides the silicon germanium layer, according to various embodiments of the present invention. The left side of the figure illustrates a substrate, such as an SOI substrate 1266, and the right side of the figure represents a germanium ion doping profile 1267. The profile 1267 illustrates a single germanium ion implantation process step 1268, in which germanium ions are implanted at a desired dose and energy to form the silicon region containing germanium ions, represented at 1257A in FIG. 11C.

FIG. 12B illustrates a doping profile for forming an epitaxial silicon germanium (SiGe) proximity gettering layer in which multiple germanium implants provide a graded germanium concentration, according to various embodiments of the present invention. The left side of the figure illustrates a substrate, such as an SOI substrate 1266, and the right side of the figure represents a germanium ion doping profile 1267. The profile 1267 illustrates a first germanium ion implantation process step 1269 in which germanium ions are implanted at a first desired dose and energy and a second germanium ion implantation step 1270 in which germanium ions are implanted at a second desired dose and energy. These germanium ion implant steps form the silicon region containing germanium ions, represented at 1257A in FIG. 1C. The concentration of the germanium in the silicon is graded. One of ordinary skill in the art will appreciate, upon reading and comprehending this disclosure, that additional germanium ion implant steps can be performed to control the germanium concentration, and that a relaxed silicon germanium layer can be formed by appropriately grading the germanium ion content such that less germanium ions are implanted near the silicon substrate, and more and more germanium ions are implanted closer to the silicon layer. One of ordinary skill in the art will appreciate, upon reading and comprehending this disclosure, that without grading the germanium concentration, the resulting silicon germanium layer has a slight strain attributable to the lattice mismatch of the silicon germanium layer and the silicon substrate beneath the silicon germanium layer. Various embodiments include silicon germanium layer that have a relaxed surface and that have a slightly strained surface.

FIG. 12C illustrates a doping profile for forming an epitaxial silicon germanium (SiGe) proximity gettering layer in which multiple germanium implants provide a graded germanium concentration, a first silicon implant reduces germanium ion channeling, and a second silicon implant further amorphizes the silicon layer, according to various embodiments of the present subject mater. The left side of the figure illustrates a substrate, such as an SOI substrate 1266, and the right side of the figure illustrates a doping profile 1267. The first silicon implant 1271 prepares the silicon substrate 1266 for the germanium ion implantion by amorphizing the substrate to a desired depth. Thus, undesirable channeling is reduced, and the depth of the germanium ion implants 1269 and 1270 can be more accurately controlled. As discussed above with respect to FIG. 12B, the multiple germanium ion implant steps provide a graded germanium concentration, which results in a relaxed, or at least partially relaxed, silicon germanium surface upon which a crystalline silicon layer is regrown from an amorphized silicon layer located over the silicon region that contains germanium ions. The implantation of the germanium ions at least partially amorphizes the silicon layer. The second silicon implant 1272 further amorphizes the silicon layer in preparation for regrowing the crystalline silicon layer.

Figure 13:
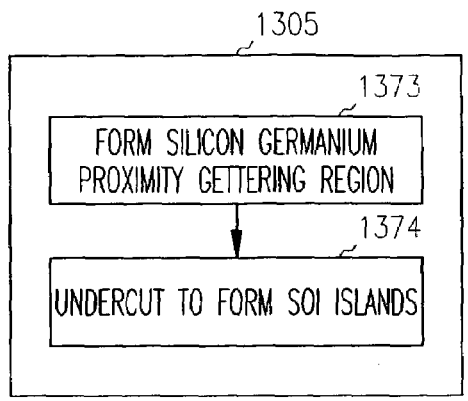
FIG. 13 illustrates a method for forming a relaxed silicon germanium gettering region to be proximate to a device region for a silicon on insulator (SOI) structure according to various embodiments of the present invention.

FIG. 13 illustrates a method for forming a relaxed silicon germanium gettering region to be proximate to a device region for a silicon on insulator (SOI) structure according to various embodiments of the present invention. The illustrated method 1305 includes forming a silicon germanium proximity gettering region in a wafer at 1373, and undercutting portions of the wafer to form SOI islands at 1374. Each SOI island includes a portion of the silicon germanium proximity gettering region. The undercutting process has been previously shown and described with respect to FIGS. 8A-8E, and as such will not be described here in detail. The silicon germanium region is capable of being formed using a number of methods, including: bonding such was described with respect to FIGS. 9A-9B; deposition (e.g. UHV CVD) such as was described with respect to FIGS. 10A-10C; implanting germanium ions into silicon and heating treating to provide SPE growth such as was described with respect to FIGS. 11A-11H. One of ordinary skill in the art will understand, upon reading and comprehending this disclosure, how to form a silicon germanium gettering region in a silicon wafer according to any of these processes, and how to undercut the resulting structure to form SOI structures with silicon germanium proximity gettering regions. As such, these processes will not be described here for the sake of brevity.

Figure 14A:
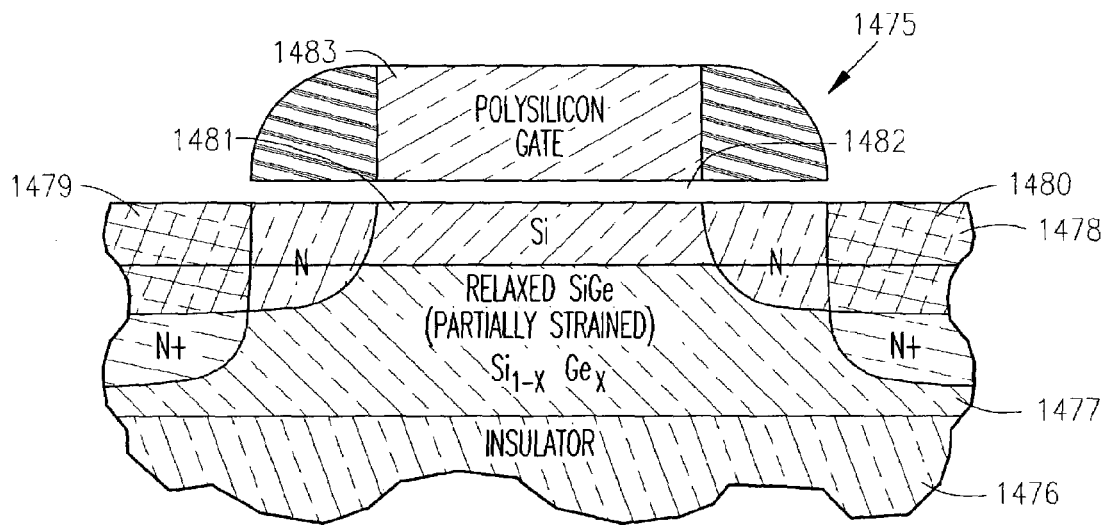
FIGS. 14A-14B illustrate a transistor structure with a silicon layer on a relaxed (partially strained and fully strained) silicon germanium layer, including a silicon layer on a partially strained silicon germanium layer and a silicon layer on a relaxed silicon germanium layer having a graded germanium concentration, respectively, according to various embodiments of the present invention.
Figure 14B:
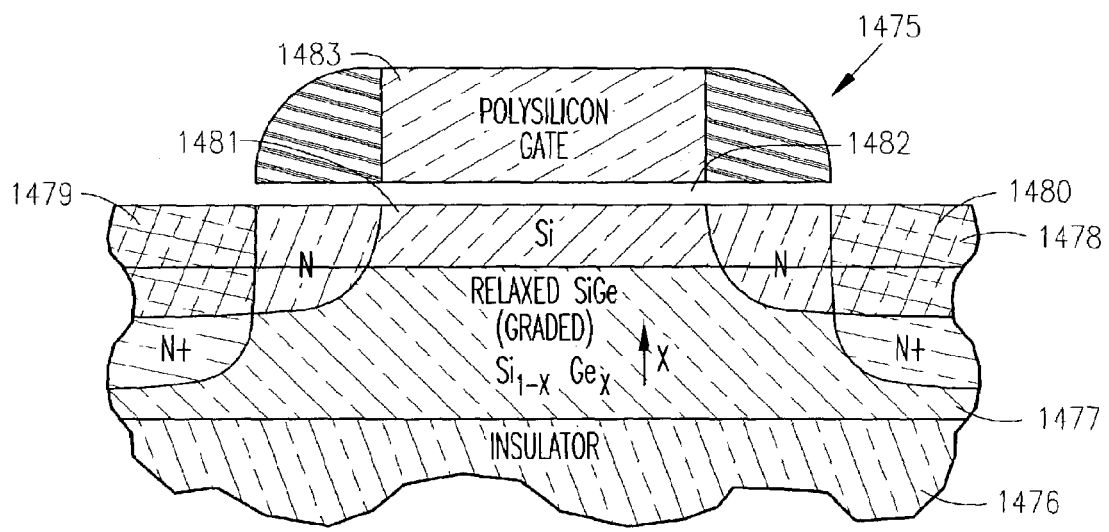

FIGS. 14A-14B illustrate a transistor structure with a silicon layer on a relaxed (partially strained and fully strained) silicon germanium layer, including a silicon layer on a partially strained silicon germanium layer and a silicon layer on a relaxed silicon germanium layer having a graded germanium concentration, respectively, according to various embodiments of the present invention. Both FIGS. 14A and 14B illustrate a transistor structure 1475 such as may be formed on a p-type SOI substrate 1476. One of ordinary skill in the art will understand, upon reading and comprehending this disclosure, that the transistor structure 1475 may be formed on a n-type SOI substrate. A silicon germanium layer ($Si_{1-x}Ge_x$) 1477 is positioned over the SOI substrate 1476, and a silicon layer 1478 is positioned over the silicon germanium layer ($Si_{1-x}Ge_x$) layer. The formation of the silicon germanium ($Si_{1-x}Ge_x$) layer 1477 and the silicon layer 1478 has been described above. First and second diffusion regions 1479 and 1480 are formed by implanting n-type impurities. The illustrated structures show each diffusion region with an n-type area and an n+ type area. If the SOI substrate is an n-type substrate, the first and second diffusion regions are formed by implanting p-type impurities. The illustrated diffusion regions are formed in the silicon layer, and extend into the silicon germanium layer. The silicon layer 1478 forms a channel region 1481 which extends between the diffusion regions 1479 and 1480. A gate dielectric 1482 (such as a gate oxide), is formed over the channel region 1481, and a gate 1483 is formed over the gate dielectric 1482 to control electron current through the channel region 1481 between the n-type diffusion regions 1479 and 1480.

The silicon germanium layer 1477 in the structure illustrated in FIG. 14A is formed without grading the germanium ion content. The lattice mismatch of the SOI substrate 1476 beneath the silicon germanium layer 1477 causes the surface of the silicon germanium layer to be partially strained. The germanium ion content is graded to form the relaxed silicon germanium layer 1477 in the structure illustrated in FIG. 14B. As represented by the arrow and the reference "X", the germanium content increases further away from the silicon substrate. This grading of the germanium content reduces the effect that the lattice mismatch between the SOI substrate 1476 and the silicon germanium layer 1477. Thus, the surface of the silicon germanium layer is relaxed, or at least partially relaxed.

In various embodiments, the silicon layer 1478 is sufficiently thick such that it is not strained by a lattice mismatch between the silicon germanium 1477 and the silicon layer 1478. In various embodiments, the silicon layer 1478 is sufficiently thin to be strained by a lattice mismatch between the silicon germanium 1477 and the silicon layer 1478. In various embodiments, the thin silicon layer is ultra thin. In various embodiments, the thin silicon layer has a thickness of approximately 2000 Å or less. In various embodiments, the thin silicon layer has a thickness of approximately 1000 Å or less. In various embodiments, the thin silicon layer has a thickness in a range of approximately 300 to approximately 1000 Å.

Figure 15:
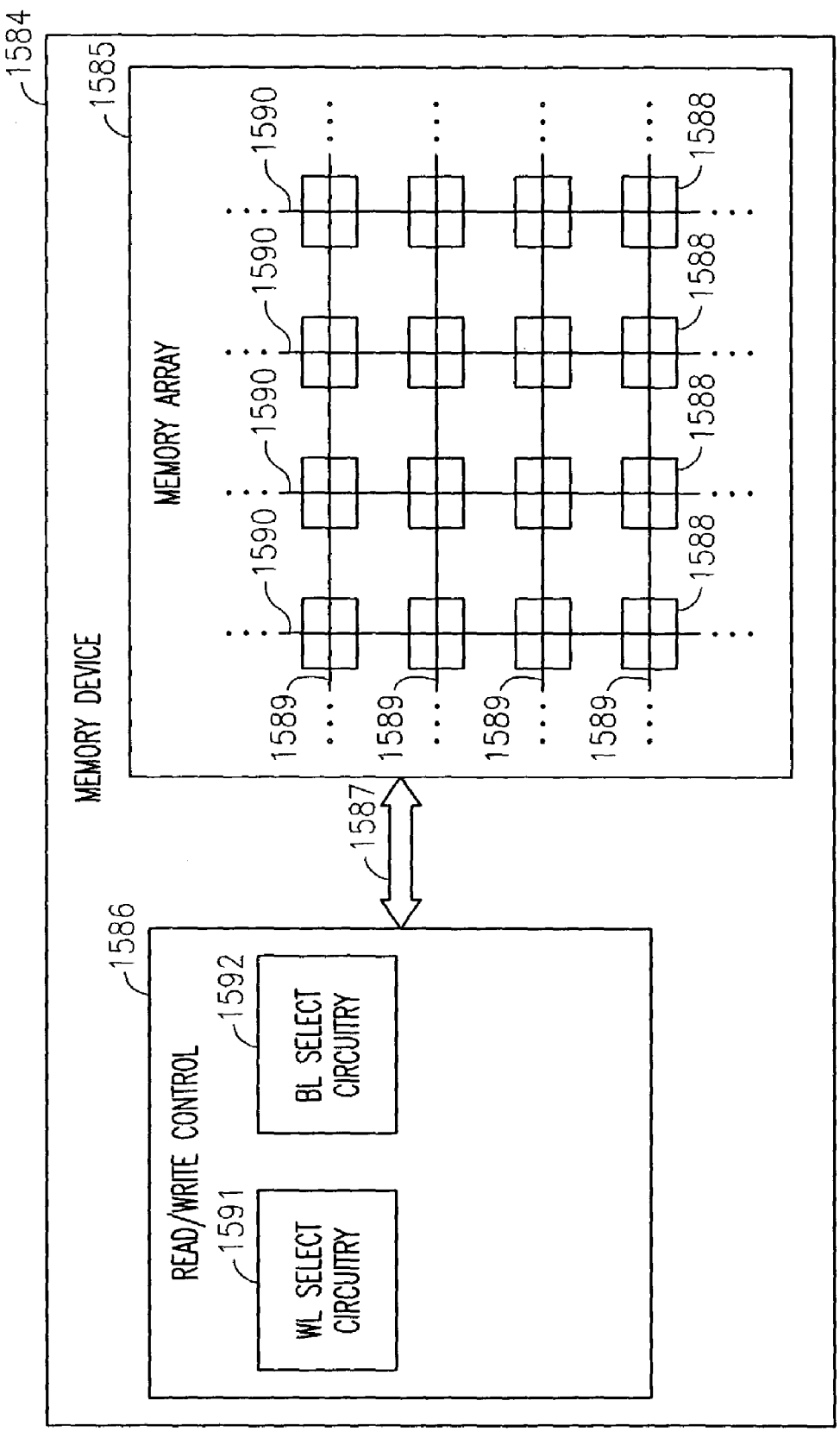
FIG. 15 is a simplified block diagram of a high-level organization of various embodiments of a memory device according to various embodiments of the present invention.

FIG. 15 is a simplified block diagram of a high-level organization of various embodiments of a memory device according to various embodiments of the present invention. The illustrated memory device 1584 includes a memory array 1585 and read/write control circuitry 1586 to perform operations on the memory array via communication line(s) 1587. The illustrated memory device 1584 may be a memory card or a memory module such as a single inline memory module (SIMM) and dual inline memory module (DIMM). One of ordinary skill in the art will understand, upon reading and comprehending this disclosure, that semiconductor components in the memory array 1585 and/or the control circuitry 1586 are able to be fabricated using the relaxed silicon germanium proximity gettering regions, as described above. The structure and fabrication methods for these strained body layers have been described above.

The memory array 1585 includes a number of memory cells 1588. The memory cells in the array are arranged in rows and columns. In various embodiments, word lines 1589 connect the memory cells in the rows, and bit lines 1590 connect the memory cells in the columns. The read/write control circuitry 1586 includes word line select circuitry 1591, which functions to select a desired row. The read/write control circuitry 1586 further includes bit line select circuitry 1592, which functions to select a desired column.

Figure 16:
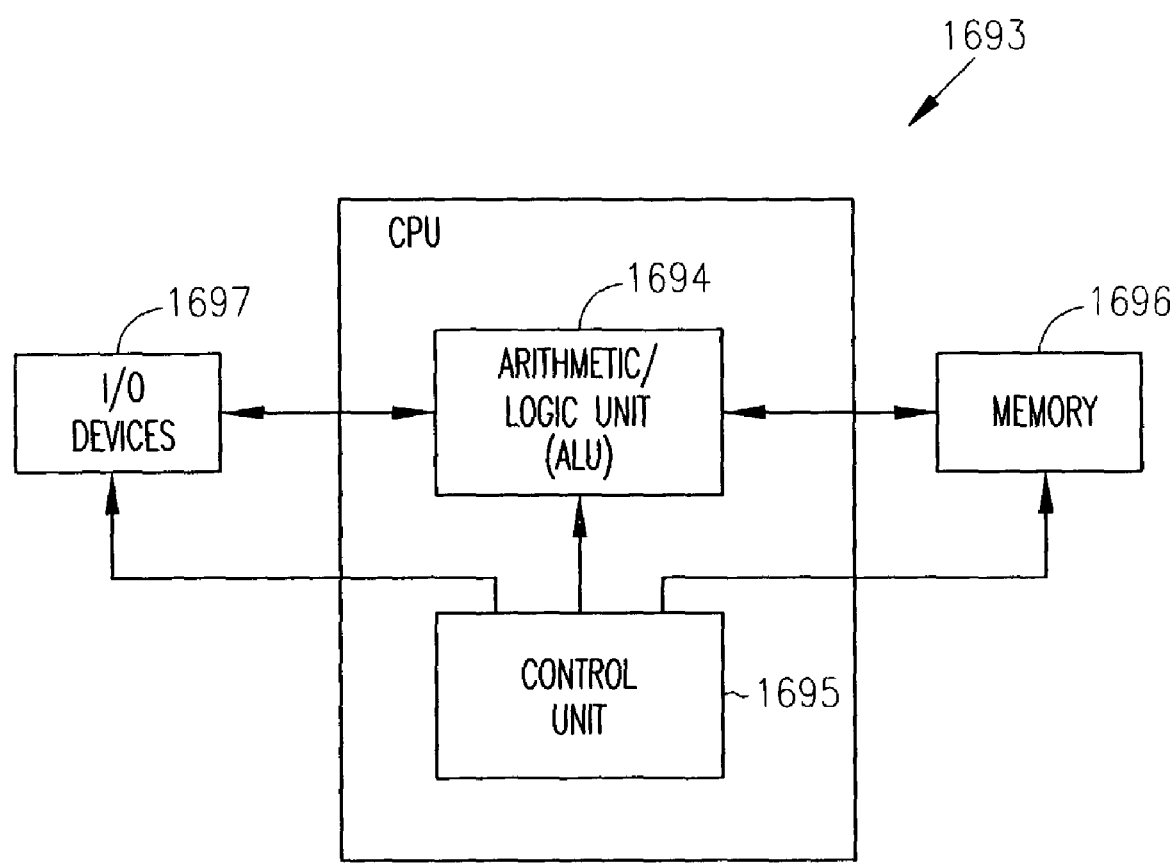
FIG. 16 is a simplified block diagram of a high-level organization of various embodiments of an electronic system according to the present invention.

FIG. 16 is a simplified block diagram of a high-level organization of various embodiments of an electronic system according to the present invention. In various embodiments, the system 1693 is a computer system, a process control system or other system that employs a processor and associated memory. The electronic system 1693 has functional elements, including a processor or arithmetic/logic unit (ALU) 1694, a control unit 1695, a memory device unit 1696 (such as illustrated in FIG. 15) and an input/output (I/O) device 1697. Generally such an electronic system 1693 will have a native set of instructions that specify operations to be performed on data by the processor 1694 and other interactions between the processor 1694, the memory device unit 1696 and the I/O devices 1697. The control unit 1695 coordinates all operations of the processor 1694, the memory device 1696 and the I/O devices 1697 by continuously cycling through a set of operations that cause instructions to be fetched from the memory device 1696 and executed. According to various embodiments, the memory device 1696 includes, but is not limited to, random access memory (RAM) devices, read-only memory (ROM) devices, and peripheral devices such as a floppy disk drive and a compact disk CD-ROM drive. As one of ordinary skill in the art will understand, upon reading and comprehending this disclosure, any of the illustrated electrical components are capable of being fabricated to include gettering regions in accordance with various embodiments of the present invention.

The illustration of the system 1693 is intended to provide a general understanding of one application for the structure and circuitry, and is not intended to serve as a complete description of all the elements and features of an electronic system using relaxed silicon germanium proximity gettering regions according to the various embodiments of the present invention. As one of ordinary skill in the art will understand, such an electronic system can be fabricated in single-package processing units, or even on a single semiconductor chip, in order to reduce the communication time between the processor and the memory device.

Applications containing gettering regions as described in this disclosure include electronic systems for use in memory modules, device drivers, power modules, communication modems, processor modules, and application-specific modules, and may include multilayer, multichip modules. Such circuitry can further be a subcomponent of a variety of electronic systems.

CONCLUSION

Various embodiments disclosed herein provide methods to getter silicon on insulator (SOI) wafers using a relaxed silicon germanium epitaxial layer immediately under the device areas. The relaxation of the silicon germanium lattice strain and/or the injection of silicon interstitials when the germaniium is substitutionally incorporated into the lattice to generate defects. These defects serve to getter unwanted impurities from the device areas.

This disclosure includes several processes, circuit diagrams, and structures. The present invention is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations. It is to be understood that the above description is intended to be illustrative, and not restrictive. Combinations of the above embodiments, and other embodiments, will be apparent to those of skill in the art upon reviewing the above description. The scope of the present invention should be determined with reference to the appended claims, along with the full scope of equivalents to which such claims are entitled.

What is claimed is:

1. A method for creating proximity gettering sites in a silicon on insulator (SOI) wafer, comprising:
   forming a relaxed silicon germanium region over an insulator region in the SOI wafer to be proximate to a device region,
   wherein the relaxed silicon germanium region generates defects to getter impurities from the device region.

2. The method of claim 1, wherein forming a relaxed silicon germanium region includes grading germanium content in the silicon germanium region.

3. The method of claim 1, wherein forming a relaxed silicon germanium region includes forming a partially strained silicon germanium region.

4. The method of claim 1, wherein forming a relaxed silicon germanium region includes performing an ultra high vacuum chemical vapor deposition (UHV CVD) process.

5. The method of claim 1, wherein forming a relaxed silicon germanium region includes:
  implanting germanium into silicon of the SOI wafer to a desired depth, which at least partially amorphizes a top layer of silicon over germanium implants; and
  annealing to form the silicon germanium layer and to transform the at least partially amorphized top layer of silicon into a crystalline silicon layer for the device region.

6. The method of claim 1, wherein forming a relaxed silicon germanium region includes bonding the silicon germanium region to the SOI wafer.

7. The method of claim 1, wherein forming a relaxed silicon germanium region includes performing a bond cut process to bond the silicon germanium region to the SOI wafer.

8. A method for creating proximity gettering sites in a silicon on insulator (SOI) wafer, comprising:
  forming a relaxed silicon germanium region over an insulator region in the SOI wafer to be proximate to a device region,
  wherein the relaxed silicon germanium region generates defects to getter impurities from the device region,
  wherein:
    the silicon germanium region includes a silicon germanium layer;
    the device region includes a crystalline silicon layer; and
    forming a relaxed silicon germanium region to be proximate to a device region on the silicon wafer includes:
      forming the silicon germanium layer; and
      forming the crystalline silicon layer on the silicon germanium layer.

9. The method of claim 8, wherein:
  the silicon germanium region includes a silicon germanium layer;
  the device region includes a crystalline silicon layer; and
  forming a relaxed silicon germanium region to be proximate to a device region on the silicon wafer includes:
    implanting germanium into the silicon wafer to a desired depth, wherein implanting germanium at least partially amorphizes a top layer of silicon over germanium implants; and
    annealing to form the silicon germanium layer and to form the crystalline silicon layer over the silicon germanium layer.

10. The method of claim 8, wherein:
  the silicon germanium region includes a silicon germanium layer;
  the device region includes a crystalline silicon layer; and
  forming a relaxed silicon germanium region to be proximate to a device region on the silicon wafer includes bonding the silicon germanium layer on a substrate that includes an insulator region.

11. The method of claim 10, further comprising bonding the crystalline silicon layer to the silicon germanium layer.

12. The method of claim 8, wherein:
  the silicon germanium region includes a silicon germanium layer;
  the device region includes a crystalline silicon layer; and
  forming a relaxed silicon germanium region to be proximate to a device region on the silicon wafer includes performing a bond cut process to bond the silicon germanium layer on a substrate that includes an insulator region.

13. A method for creating proximity gettering sites in a silicon on insulator (SOI) wafer, comprising:
  forming a relaxed silicon germanium region over an insulator region of the SOI wafer to be proximate to a device region, wherein forming a relaxed silicon germanium region includes:
    implanting germanium ions into a silicon substrate with a desired dose and energy to form a silicon region containing germanium ions beneath a silicon layer in the substrate and to at least partially amorphize the silicon layer; and
    heat treating the substrate to transform the silicon region containing germanium ions into the silicon germanium region and to form a crystalline silicon layer over the silicon germanium region using a solid phase epitaxial (SPE) process, the crystalline silicon layer including the device region,
  wherein the relaxed silicon germanium region generates defects to getter impurities from the device region.

14. The method of claim 13, wherein implanting germanium ions into a silicon substrate includes performing two or more germanium ion implants where each germanium ion implant has a desired dose and energy such that the two or more germanium ion implants form the silicon germanium layer with a desired graded germanium content.

15. The method of claim 13, further comprising further amorphizing the silicon layer over the silicon germanium layer before heat treating the substrate.

16. The method of claim 13, further comprising preparing the substrate to discourage ion channeling before implanting germanium ions into the silicon substrate.

17. The method of claim 13, wherein implanting germanium ions into a silicon substrate with a desired dose and energy includes implanting germanium ions in a desired manner to form the silicon germanium region with a partially strained surface upon which the crystalline silicon layer is regrown.

18. The method of claim 13, wherein implanting germanium ions into a silicon substrate with a desired dose and energy includes implanting germanium ions in a desired manner to form the silicon germanium layer with a relaxed surface upon which the crystalline silicon layer is regrown.

19. The method of claim 13, wherein heat treating the substrate includes heat treating the substrate with a temperature in a range from approximately 550° C. to approximately 700° C. for a period of time in a range from approximately one hour to approximately two hours.

20. A method for creating proximity gettering sites in a silicon on insulator (SOI) wafer, comprising:
  epitaxially forming a relaxed silicon germanium layer over an insulator region of the SOI wafer to be proximate to a device region,
  wherein the relaxed silicon germanium region generates defects to getter impurities from the device region.

21. The method of claim 20, wherein epitaxially forming a relaxed silicon germanium layer includes performing an ultra high vacuum chemical vapor deposition (UHV CVD) process to form the relaxed silicon germanium layer.

22. A method for creating proximity gettering sites in a silicon on insulator (SOI) wafer, comprising:
  forming a relaxed silicon germanium region over an insulator region of the SOI wafer to be proximate to a crystalline silicon layer for a device region on the semiconductor wafer, wherein:
the relaxed silicon germanium region generates defects to getter impurities from the device region; and
the crystalline silicon layer is sufficiently thick such that the crystalline silicon layer is not strained by a lattice mismatch with the silicon germanium region.

23. A method for creating proximity gettering sites in a silicon on insulator (SOI) wafer, comprising:
forming a relaxed silicon germanium region over an insulator region of the SOI wafer to be proximate to a crystalline silicon layer for a device region,
wherein:
the relaxed silicon germanium region generates defects to getter impurities from the device region;
the crystalline silicon layer is sufficiently thin such that the crystalline silicon layer is strained by a lattice mismatch with the silicon germanium region; and
the strain in the crystalline silicon layer enhances carrier mobility.

24. The method of claim 23, wherein the crystalline silicon layer is ultra thin.

25. The method of claim 23, wherein the crystalline silicon layer has a thickness less than approximately 2000 Å.

26. The method of claim 23, wherein the crystalline silicon layer has a thickness of approximately 1000 Å or less.

27. The method of claim 23, wherein the crystalline silicon layer has a thickness within a range of approximately 300 Å to approximately 1000 Å.

28. A method for creating proximity gettering sites in a silicon on insulator (SOI) wafer, comprising:
forming a relaxed silicon germanium region over an insulator region of the SOI wafer to contact a crystalline silicon layer for a device region, including:
implanting silicon ions with a desired dose and a desired energy into a silicon region of the SOI wafer to amorphize the silicon to a desired depth to discourage ion implant channeling;
implanting germanium ions into the silicon region with at least a first desired dose and energy to form a silicon region containing germanium ions beneath a silicon layer in the substrate and to at least partially amorphize the silicon layer, the first desired dose and energy and the second desired dose and energy providing a graded germanium concentration;
implanting silicon ions with a desired dose and energy to further amorphize the silicon layer; and
heat treating the wafer to transform the silicon region containing germanium ions to a relaxed silicon germanium layer and form a crystalline silicon layer over the silicon germanium layer using a solid phase epitaxial (SPE) process, the crystalline silicon layer being strained by a lattice mismatch between the silicon germanium layer and the crystalline silicon layer,
wherein the relaxed silicon germanium region generates defects to getter impurities from the crystalline silicon layer.

29. The method of claim 28, wherein:
implanting silicon ions with a desired dose and a desired energy into a silicon substrate to amorphize the silicon substrate to a desired depth to discourage ion implant channeling includes implanting silicon ions with an energy greater than approximately 170 KeV and a dose of approximately $10^{15}/cm^2$;
implanting germanium ions into the silicon substrate with at least a first desired dose and energy includes implanting germanium ions with an energy of approximately 200 KeV and a dose of approximately $10^{20}/cm^2$; and
implanting silicon ions with a desired dose and energy to further amorphize the silicon layer includes implanting silicon ions with an energy less than approximately 170 KeV and a dose of approximately $10^{15}/cm^2$.

30. The method of claim 28, wherein implanting germanium ions into the silicon substrate with at least a first desired dose and energy includes implanting germanium ions with a second desired dose and energy such that the first desired dose and energy and the second desired dose and energy provide a graded germanium concentration.

31. The method of claim 28, wherein heat treating the substrate to regrow a crystalline silicon layer over a resulting silicon germanium layer using a solid phase epitaxial (SPE) process includes heat treating the substrate with a temperature in a range from approximately 550° C. to approximately 700° C. for a period of time in a range from approximately one hour to approximately two hours.

32. A method for creating proximity gettering sites in a silicon on insulator (SOI) wafer, comprising:
forming a relaxed silicon germanium gettering region over an insulator region of the SOI wafer to be proximate to a device region, wherein the relaxed silicon germanium region generates defects; and
performing subsequent semiconductor fabrication processes, including fabricating a semiconductor device in the device region, wherein the defects generated by the relaxed silicon germanium gettering region getters unwanted impurities from the device region during the subsequent semiconductor fabrication processes.

33. The method of claim 32, wherein forming a relaxed silicon germanium gettering region include performing an ultra high vacuum chemical vapor deposition (UHV CVD) process to epitaxially form the relaxed silicon germanium gettering region.

34. The method of claim 32, wherein forming a relaxed silicon germanium gettering region includes:
implanting germanium ions into a silicon substrate with a desired dose and energy to form a silicon region containing germanium ions beneath a silicon layer in the substrate and to at least partially amorphize the silicon layer; and
heat treating the substrate to regrow a crystalline silicon layer over a resulting silicon germanium layer using a solid phase epitaxial (SPE) process.

35. The method of claim 32, wherein forming a relaxed silicon germanium region includes:
implanting germanium into silicon of the SOI wafer to a desired depth, which at least partially amorphizes a top layer of silicon over germanium implants; and
annealing to form the silicon germanium layer and to transform the at least partially amorphized top layer of silicon into a crystalline silicon layer for the device region.

36. The method of claim 32, wherein forming a relaxed silicon germanium region includes bonding the silicon germanium region to the SOI wafer.

37. The method of claim 32, wherein forming a relaxed silicon germanium region includes performing a bond cut process to bond the silicon germanium region to the SOI wafer.

38. A method for forming a silicon on insulator (SOI) structure, comprising:
forming a relaxed silicon germanium gettering region over an insulator region to be proximate to a device region; and
performing subsequent semiconductor fabrication processes, including fabricating a semiconductor device in the device region, wherein the defects generated by the relaxed silicon germanium gettering region getters unwanted impurities from the device region during the subsequent semiconductor fabrication processes.

39. The method of claim 38, wherein forming a relaxed silicon germanium gettering region includes performing an ultra high vacuum chemical vapor deposition (UHV CVD) process to epitaxially form the relaxed silicon germanium gettering region.

40. The method of claim 38, wherein forming a relaxed silicon germanium gettering region includes:
   implanting germanium ions into a silicon substrate with a desired dose and energy to form a silicon region containing germanium ions beneath a silicon layer in the substrate and to at least partially amorphize the silicon layer; and
   heat treating the substrate to regrow a crystalline silicon layer over a resulting silicon germanium layer using a solid phase epitaxial (SPE) process.

41. The method of claim 38, wherein forming a relaxed silicon germanium region includes:
   implanting germanium into silicon of the SOI wafer to a desired depth, which at least partially amorphizes a top layer of silicon over germanium implants; and
   annealing to form the silicon germanium layer and to transform the at least partially amorphized top layer of silicon into a crystalline silicon layer for the device region.

42. The method of claim 38, wherein forming a relaxed silicon germanium region includes bonding the silicon germanium region to the SOI wafer.

43. The method of claim 38, wherein forming a relaxed silicon germanium region includes performing a bond cut process to bond the silicon germanium region to the SOI wafer.

44. A method, comprising:
   forming a silicon germanium gettering region and a device region in a silicon substrate; and
   performing an undercut process to form silicon on insulator (SOI) islands, each island including a portion of the device region and a portion of the silicon germanium gettering region.

45. The method of claim 44, wherein performing an undercut process includes forming trenches in the silicon substrate to define rows, and oxidizing underneath the rows.

46. A method for forming a silicon on insulator (SOI) structure, comprising:
   forming a relaxed silicon germanium gettering region over an insulator region, wherein the relaxed silicon germanium gettering region generates defects;
   forming a device region proximate to the relaxed silicon germanium gettering region; and
   performing subsequent semiconductor fabrication processes, including fabricating a semiconductor device in the device region, wherein the defects generated by the relaxed silicon germanium gettering region getters unwanted impurities from the device region during the subsequent semiconductor fabrication processes.

47. The method of claim 46, wherein forming a relaxed silicon germanium gettering region includes performing an ultra high vacuum chemical vapor deposition (UHV CVD) process to epitaxially form the relaxed silicon germanium gettering region.

48. The method of claim 46, wherein forming a relaxed silicon germanium gettering region includes:
   implanting germanium ions into a silicon substrate with a desired dose and energy to form a silicon region containing germanium ions beneath a silicon layer in the substrate and to at least partially amorphize the silicon layer; and
   heat treating the substrate to regrow a crystalline silicon layer over a resulting silicon germanium layer using a solid phase epitaxial (SPE) process.

49. A method for forming a semiconductor structure, comprising:
   forming a device region on a silicon on insulator (SOI) wafer;
   forming a relaxed silicon germanium gettering region over an insulator region on the SOI wafer proximate to the device region, wherein the relaxed silicon germanium gettering region generates defects; and
   performing subsequent semiconductor fabrication processes, including fabricating a semiconductor device in the device region, wherein the defects generated by the relaxed silicon germanium gettering region getters unwanted impurities from the device region during the subsequent semiconductor fabrication processes.

50. The method of claim 49, wherein forming a relaxed silicon germanium gettering region includes performing an ultra high vacuum chemical vapor deposition (UHV CVD) process to epitaxially form the relaxed silicon germanium gettering region.

51. The method of claim 49, wherein forming a relaxed silicon germanium gettering region includes:
   implanting germanium ions into a silicon substrate with a desired dose and energy to form a silicon region containing germanium ions beneath a silicon layer in the substrate and to at least partially amorphize the silicon layer; and
   heat treating the substrate to regrow a crystalline silicon layer over a resulting silicon germanium layer using a solid phase epitaxial (SPE) process.

52. A method for forming a transistor, comprising:
   forming a proximity gettering region over an insulator region in a silicon on insulator (SOI) wafer to be proximate to a crystalline silicon region, the proximity gettering region including relaxed silicon germanium;
   forming a gate dielectric over the crystalline silicon region;
   forming a gate over the gate dielectric; and
   forming a first diffusion region and a second diffusion region in the crystalline silicon region, the first and second diffusion regions being separated by a channel region formed in the crystalline silicon region between the gate and the proximity gettering region.

53. The method of claim 52, wherein forming a relaxed silicon germanium gettering region includes performing an ultra high vacuum chemical vapor deposition (UHV CVD) process to epitaxially form the relaxed silicon germanium gettering region.

54. The method of claim 52, wherein forming a relaxed silicon germanium gettering region includes:
   implanting germanium ions into a silicon substrate with a desired dose and energy to form a silicon region containing germanium ions beneath a silicon layer in the substrate and to at least partially amorphize the silicon layer; and
   heat treating the substrate to regrow a crystalline silicon layer over a resulting silicon germanium layer using a solid phase epitaxial (SPE) process.

55. The method of claim 52, wherein forming a proximity gettering region to be proximate to a crystalline silicon region in a wafer includes forming the proximity gettering region to contact the crystalline silicon region.

56. The method of claim 52, wherein forming a relaxed silicon germanium region includes:
  implanting germanium into silicon of the SOI wafer to a desired depth, which at least partially amorphizes a top layer of silicon over germanium implants; and
  annealing to form the silicon germanium layer and to transform the at least partially amorphized top layer of silicon into a crystalline silicon layer for the device region.

57. The method of claim 52, wherein forming a relaxed silicon germanium region includes bonding the silicon germanium region to the SOI wafer.

58. The method of claim 52, wherein forming a relaxed silicon germanium region includes performing a bond cut process to bond the silicon germanium region to the SOI wafer.

59. The method of claim 52, wherein forming a proximity gettering region over an insulator region in a silicon on insulator (SOI) wafer to be proximate to a crystalline silicon region includes forming the SOI wafer.

60. The method of claim 59, wherein forming the SOI wafer includes implanting oxygen into a silicon substrate and annealing the substrate.

61. The method of claim 59, wherein forming the SOI wafer includes performing a bonding process to form the SOI wafer.

62. The method of claim 59, wherein forming the SOI wafer includes performing a bond cut process to form the SOI wafer.

63. The method of claim 59, wherein forming the SOI wafer includes performing an undercut process.

64. The method of claim 52, wherein forming a proximity gettering region over an insulator region in a silicon on insulator (SOI) wafer to be proximate to a crystalline silicon region includes:
  bonding a silicon germanium layer to a substrate having an insulator region; and
  bonding a crystalline silicon layer to the silicon germanium layer.

65. The method of claim 52, wherein forming a proximity gettering region over an insulator region in a silicon on insulator (SOI) wafer to be proximate to a crystalline silicon region includes:
  depositing a silicon germanium layer on a substrate having an insulator region; and
  depositing a crystalline silicon layer on the silicon germanium layer.

66. A method for forming a transistor, comprising:
  forming a proximity gettering region over an insulator region of a silicon on insulator (SOI) wafer to be proximate to a crystalline silicon region, the proximity gettering region including relaxed silicon germanium, the crystalline silicon region being positioned on the silicon germanium such that a lattice mismatch strains the crystalline silicon region;
  forming a gate dielectric over the crystalline silicon region;
  forming a gate over the gate dielectric; and
  forming a first diffusion region and a second diffusion region in the strained crystalline silicon region, the first and second diffusion regions being separated by a channel region formed in the crystalline silicon region between the gate and the proximity gettering region.

67. The method of claim 66, wherein forming a relaxed silicon germanium gettering region includes performing an ultra high vacuum chemical vapor deposition (UHV CVD) process to epitaxially form the relaxed silicon germanium gettering region.

68. The method of claim 66, wherein forming a relaxed silicon germanium gettering region includes:
  implanting germanium ions into a silicon substrate with a desired dose and energy to form a silicon region containing germanium ions beneath a silicon layer in the substrate and to at least partially amorphize the silicon layer; and
  heat treating the substrate to regrow a crystalline silicon layer over a resulting silicon germanium layer using a solid phase epitaxial (SPE) process.

69. The method of claim 66, wherein forming a proximity gettering region to be proximate to a crystalline silicon region in a wafer includes forming the proximity gettering region to contact the crystalline silicon region.

70. A method for forming a memory device, comprising:
  forming a memory array in a silicon on insulator (SOI) substrate, including forming a plurality of memory cells in rows and columns and forming at least one transistor for each of the plurality of memory cells;
  forming a plurality of word lines, including connecting each word line to a row of memory cells;
  forming a plurality of bit lines, including connecting each bit line to a column of memory cells;
  forming control circuitry in the semiconductor substrate, including forming word line select circuitry and bit line select circuitry for use to select a number of memory cells for writing and reading operations,
  wherein at least one of forming the memory array and forming the control circuitry includes forming at least one transistor, including:
    forming a proximity gettering region over an insulator region of the SOI substrate to be proximate to a crystalline silicon region in a wafer, the proximity gettering region including relaxed silicon germanium, the crystalline silicon region being positioned on the silicon germanium such that a lattice mismatch strains the crystalline silicon region;
    forming a gate dielectric over the crystalline silicon region;
    forming a gate over the gate dielectric; and
    forming a first diffusion region and a second diffusion region in the strained crystalline silicon region, the first and second diffusion regions being separated by a channel region formed in the crystalline silicon region between the gate and the proximity gettering region.

71. The method of claim 70, wherein forming a relaxed silicon germanium gettering region includes performing an ultra high vacuum chemical vapor deposition (UHV CVD) process to epitaxially form the relaxed silicon germanium gettering region.

72. The method of claim 70, wherein forming a relaxed silicon germanium gettering region includes:
  implanting germanium ions into a silicon substrate with a desired dose and energy to form a silicon region containing germanium ions beneath a silicon layer in the substrate and to at least partially amorphize the silicon layer; and
  heat treating the substrate to regrow a crystalline silicon layer over a resulting silicon germanium layer using a solid phase epitaxial (SPE) process.

73. The method of claim 70, wherein forming a relaxed silicon germanium region includes:
  implanting germanium into silicon of the SOI wafer to a desired depth, which at least partially amorphizes a top layer of silicon over germanium implants; and annealing to form the silicon germanium layer and to transform the at least partially amorphized top layer of silicon into a crystalline silicon layer for the device region.

74. The method of claim 70, wherein forming a relaxed silicon germanium region includes bonding the silicon germanium region to the SOI wafer.

75. The method of claim 70, wherein forming a relaxed silicon germanium region includes performing a bond cut process to bond the silicon germanium region to the SOI wafer.

* * * * *

UNITED STATES PATENT AND TRADEMARK OFFICE
CERTIFICATE OF CORRECTION

PATENT NO.       : 7,662,701 B2                                    Page 1 of 1
APPLICATION NO.  : 10/443337
DATED            : February 16, 2010
INVENTOR(S)      : Leonard Forbes It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1204 days.

Signed and Sealed this

Thirtieth Day of November, 2010

David J. Kappos
*Director of the United States Patent and Trademark Office*